United States Patent
Kato

(10) Patent No.: US 8,320,846 B2
(45) Date of Patent: Nov. 27, 2012

(54) AMPLIFIER

(75) Inventor: Takayuki Kato, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 13/007,303

(22) Filed: Jan. 14, 2011

(65) Prior Publication Data

US 2012/0027127 A1    Feb. 2, 2012

(30) Foreign Application Priority Data

Jul. 30, 2010 (JP) ................................ 2010-172733

(51) Int. Cl.
*H04B 1/02* (2006.01)
(52) U.S. Cl. ....... 455/91; 455/102; 455/108; 455/114.3; 455/127.1; 330/250; 330/252; 330/263; 330/295
(58) Field of Classification Search ............ 455/91, 455/102, 108, 114.3, 127.1, 127.3, 341; 330/250, 330/252, 263, 295, 310
See application file for complete search history.

(56) References Cited

U.S. PATENT DOCUMENTS

| | | | |
|---|---|---|---|
| 6,630,851 B2 * | 10/2003 | Masleid | 327/165 |
| 2004/0087297 A1 * | 5/2004 | Ash | 455/290 |
| 2010/0142573 A1 * | 6/2010 | Minden | 372/29.016 |

FOREIGN PATENT DOCUMENTS

JP    2001-156554    6/2001

* cited by examiner

*Primary Examiner* — Tuan Pham
(74) *Attorney, Agent, or Firm* — Oblon, Spivak, McClelland, Maier & Neustadt, L.L.P.

(57) ABSTRACT

An amplifier includes a separating unit, a generator, first to fourth switching amplifiers, and an outputting unit. The separating unit separates a pulse signal into a first separated pulse signal and a second separated pulse signal. The generator generates first to fourth low speed pulse signals by using the first and the second separated pulse signal. The first switching amplifier amplifies the first low speed pulse signal. The second switching amplifier amplifies the second low speed pulse signal by using the output of the first switching amplifier as a power-supply. The third switching amplifier amplifies the third low speed pulse signal. The fourth switching amplifier amplifies the fourth low speed pulse signal by using the output of the third switching amplifier as a power-supply. The outputting unit combines and outputs the first and the second output pulse signal.

12 Claims, 19 Drawing Sheets

US 8,320,846 B2

AMPLIFIER

CROSS-REFERENCE TO RELATED APPLICATION

This application is based upon and claims the benefit of priority from Japanese Patent Application No. 2010-172733, filed on Jul. 30, 2010, the entire contents of which are incorporated herein by reference.

FIELD

Embodiments described herein relate generally to an amplifier.

BACKGROUND

An envelope elimination and restoration (EER) power amplifier including a plurality of switching amplifiers has been proposed. The switching amplifiers amplify a pulse train and have different clock timings.

However, in the above technique, there is a drawback that the EER power amplifier could not amplify and maintain the pulse train modulated by pulse modulation.

BRIEF DESCRIPTION OF THE DRAWINGS

Aspects of this disclosure will become apparent upon reading the following detailed description and upon reference to the accompanying drawings. The description and the associated drawings are provided to illustrate non-limiting embodiments and not to limit the scope of the invention. In the drawings.

DETAILED DESCRIPTION

Figure 1:
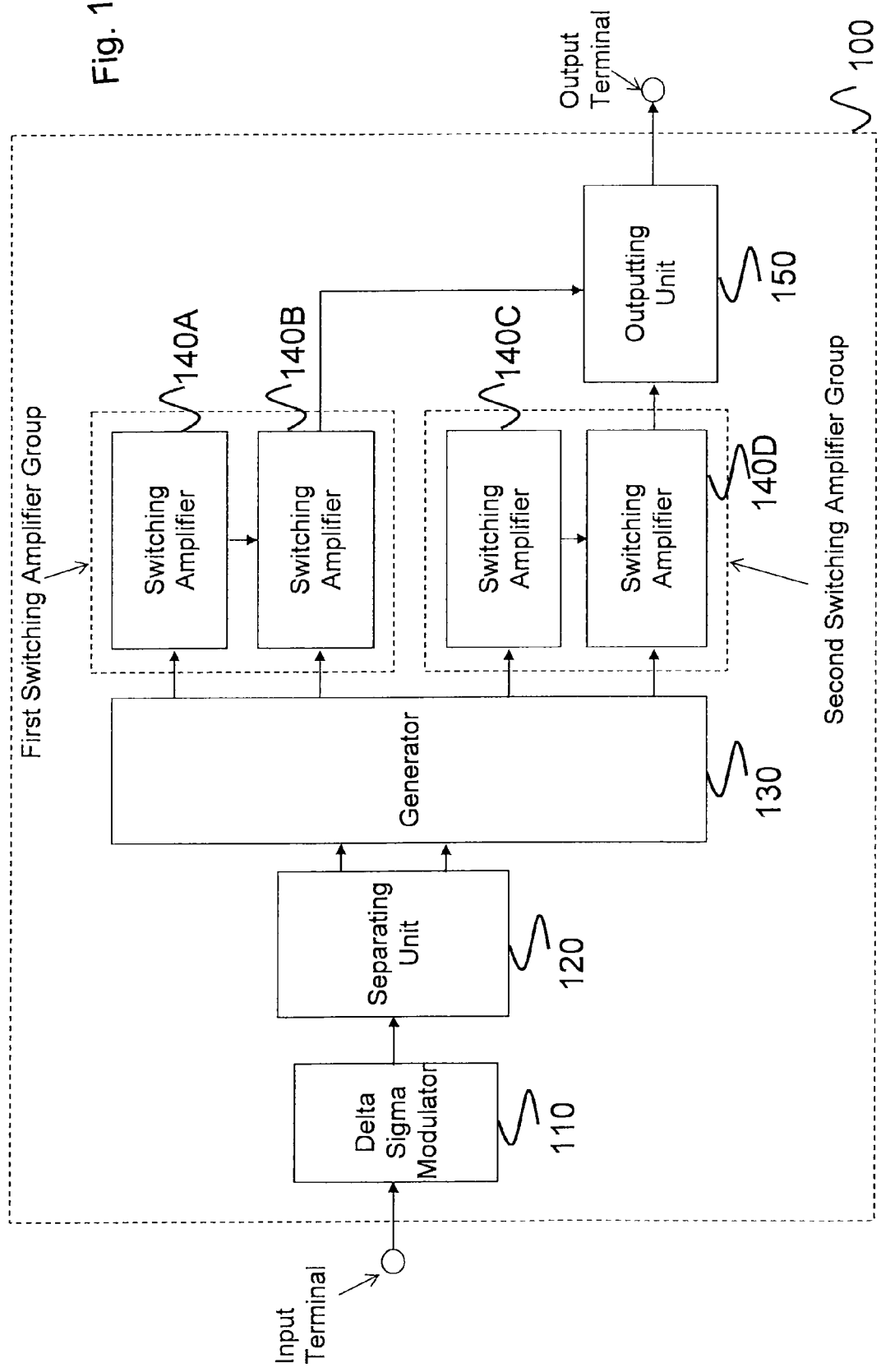
FIG. 1 is a block diagram showing an amplifier according to a first embodiment.

Referring now to the drawings, wherein like reference numerals designate identical or corresponding parts throughout the several views, non-limiting embodiments are now described.

According to one aspect of an embodiment, an amplifier includes a separating unit, a generator, first to fourth switching amplifiers, and an outputting unit. The separating unit separates a pulse signal into a first separated pulse signal and a second separated pulse signal. Each frequency of the first separated pulse signal and the second separated pulse signal is less than that of a clock signal. A logical OR of the first separated pulse signal and the second separated pulse signal is equal to the pulse signal.

The generator generates a first low speed pulse signal, a second low speed pulse signal, a third low speed pulse signal, and a fourth low speed pulse signal. Narrowest pulse widths included in the first low speed pulse signal and the second low speed pulse signal are equal to or wider than twice the width of a narrowest pulse width included in the first separated pulse signal. A logical AND of the first low speed pulse signal and the second low speed is equal to the first separated pulse signal. Narrowest pulse widths included in the third low speed pulse signal and the fourth low speed pulse signal are equal to or wider than twice the width of a narrowest pulse width included in the second separated pulse signal. A logical AND of the third low speed pulse signal and the fourth low speed is equal to the second separated pulse signal.

The first switching amplifier amplifies the first low speed pulse signal. The second switching amplifier amplifies the second low speed pulse signal by using the output of the first switching amplifier as a power-supply to obtain a first output pulse signal that is equal to a logical AND of the first low speed pulse signal and the second low speed pulse signal. The third switching amplifier amplifies the third low speed pulse signal. The fourth switching amplifier amplifies the fourth low speed pulse signal by using the output of the third switching amplifier as a power-supply to obtain a second output pulse signal that is equal to a logical AND of the third low speed pulse signal and the fourth low speed pulse signal. The outputting unit outputs a logical OR of the first output pulse signal and the second output pulse signal.

The embodiments will now be explained with reference to the accompanying drawings.

FIG. 1 is a block diagram showing an amplifier 100 according to a first embodiment. The amplifier 100 includes a delta-sigma modulator 110, a separating unit 120, a generator 130, a first switching amplifier group (switching amplifiers 140A-140B), a second switching amplifier group (switching amplifiers 140C-140D), and an outputting unit 150. The amplifier 100 amplifies a signal input by an input terminal and outputs an amplified signal at an output terminal.

Figure 2:
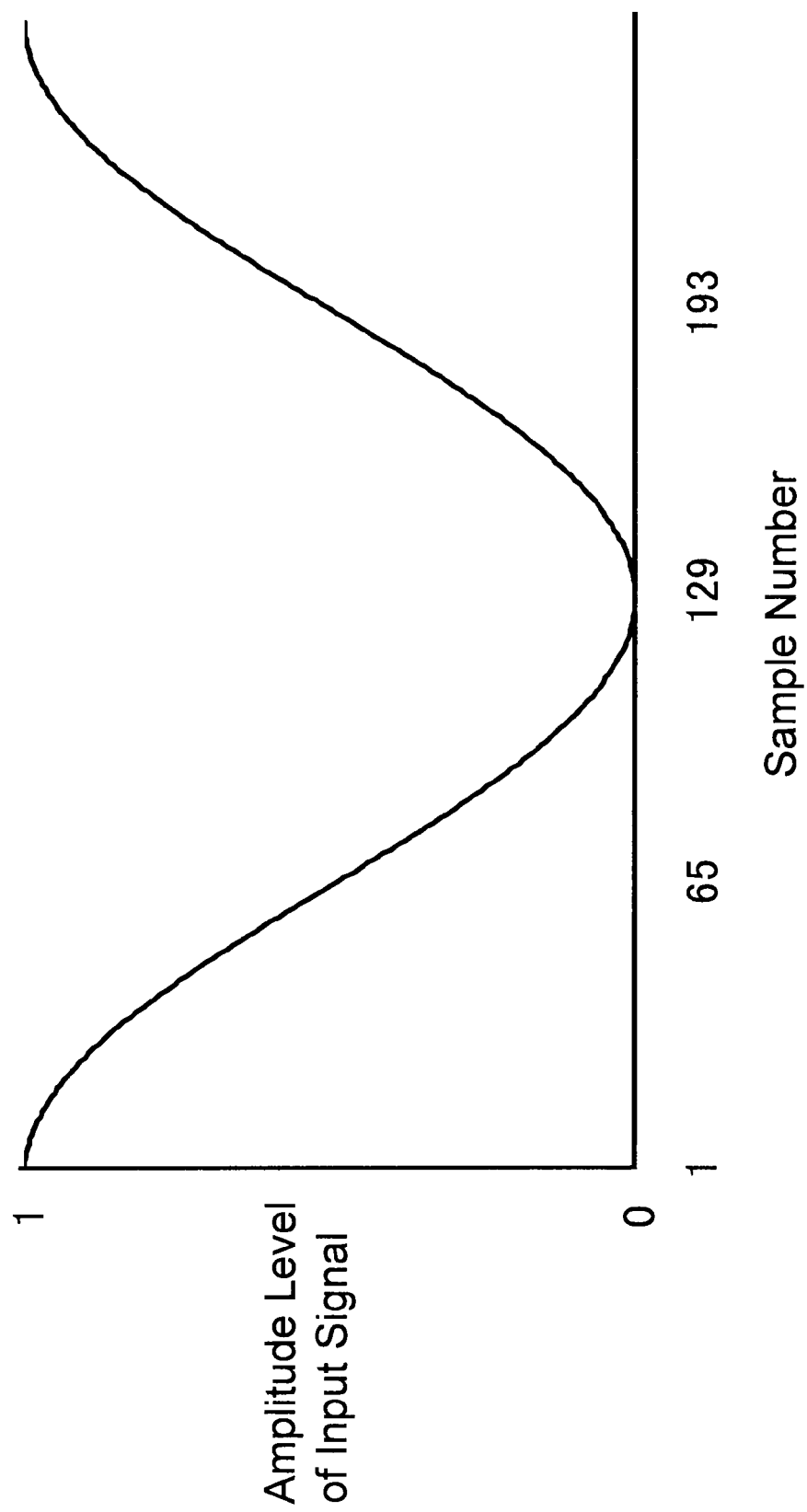
FIG. 2 is a figure showing an example of an input signal for the amplifier of FIG. 1.

FIG. 2 is a figure showing an example of an input signal (a sine wave time signal) of the amplifier 100. In FIG. 2, the horizontal axis shows sample numbers and the vertical axis shows the input signal amplitudes. FIG. 2 shows the input signal (the sine wave time signal) sampled at a sampling rate which is expressed by 256 points in 1 cycle of the sine wave time signal. The sine wave time signal shown in FIG. 2 is input to the delta-sigma modulator 110. The delta-sigma modulator 110 then outputs a delta-sigma modulated signal.

Figure 3:
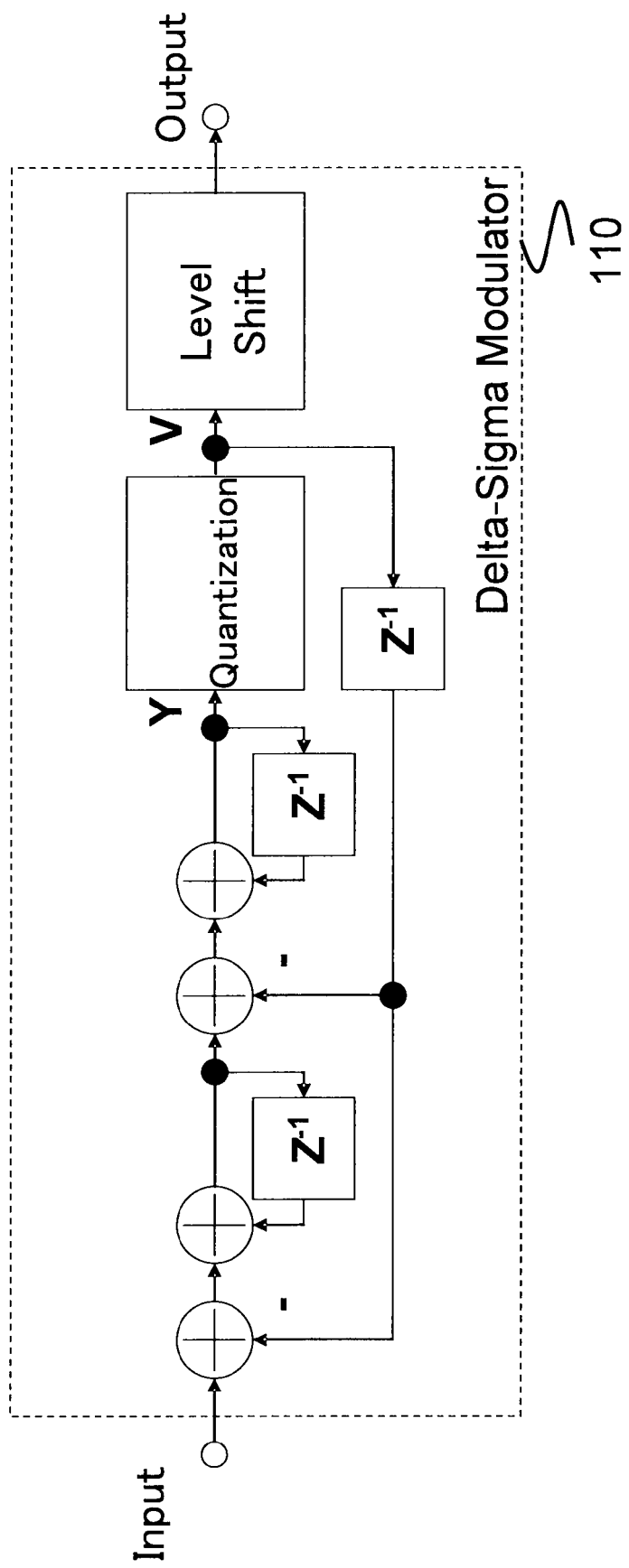
FIG. 3 is a block diagram showing an example of a delta-sigma modulator.

FIG. 3 is a block diagram showing an example of the delta-sigma modulator 110. The delta-sigma modulator 110 shown in FIG. 3 is a general 2nd-order delta-sigma modulator. The delta-sigma modulator 110 included in the amplifier 100 according to the first embodiment is not restricted to the example of the delta-sigma modulator 110 shown in FIG. 3. The delta-sigma modulator 110 modulates an input signal by a delta-sigma modulation and outputs a digital pulse signal, a value of the digital pulse signal being either one of "zero" or "one". An explanation of a processing in the delta-sigma modulator 110 is omitted, because there is a detailed explanation in a non patent reference incorporated herein by reference, titled "Understanding Delta-Sigma Data Converters", Schreier Richard, Temes Gabor C, (translation supervisors Takao Waho, Akira Yasuda), Maruzen corporation and so on.

Figure 4:
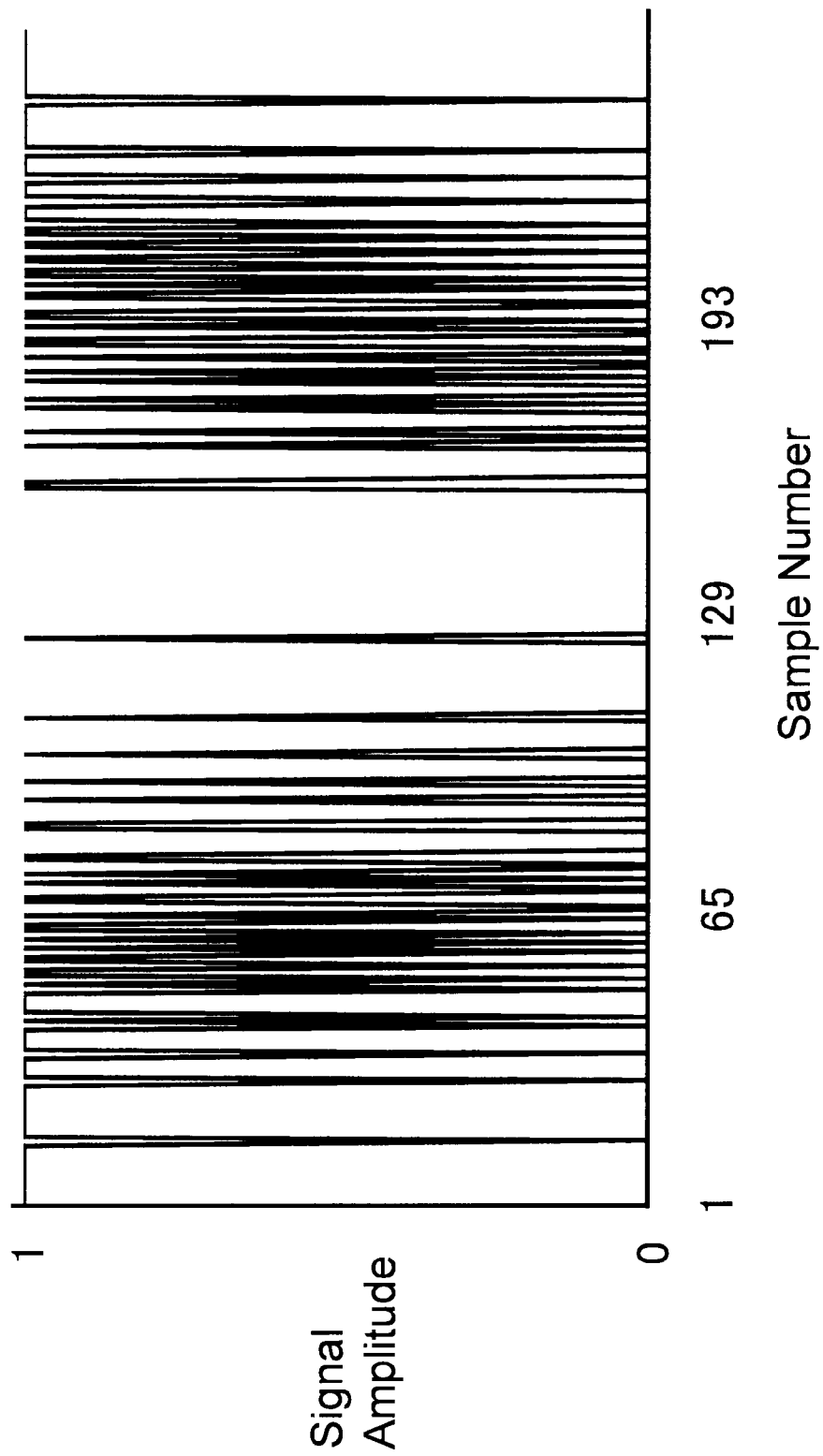
FIG. 4 is a figure showing an example of an output signal of the delta-sigma modulator of FIG. 3.

FIG. 4 is a figure showing an example of a delta-sigma modulated signal (a pulse signal) output by the delta-sigma modulator 110. The delta-sigma modulated signal is a pulse signal having a broad pulse width, in case an amplitude level of an input signal is large. The delta-sigma modulated signal is a pulse signal having a narrower and narrower pulse width, in case an amplitude level of an input signal is smaller and smaller. The delta-sigma modulated signal is a pulse signal having a very narrow pulse width and a low density (frequency), in case an amplitude level of an input signal is very small. The narrowest pulse width is equal to a half of a clock signal cycle specified by an operating clock frequency. The pulse signal output by the delta-sigma modulator 110 is sent to the separating unit 120.

Figure 5:
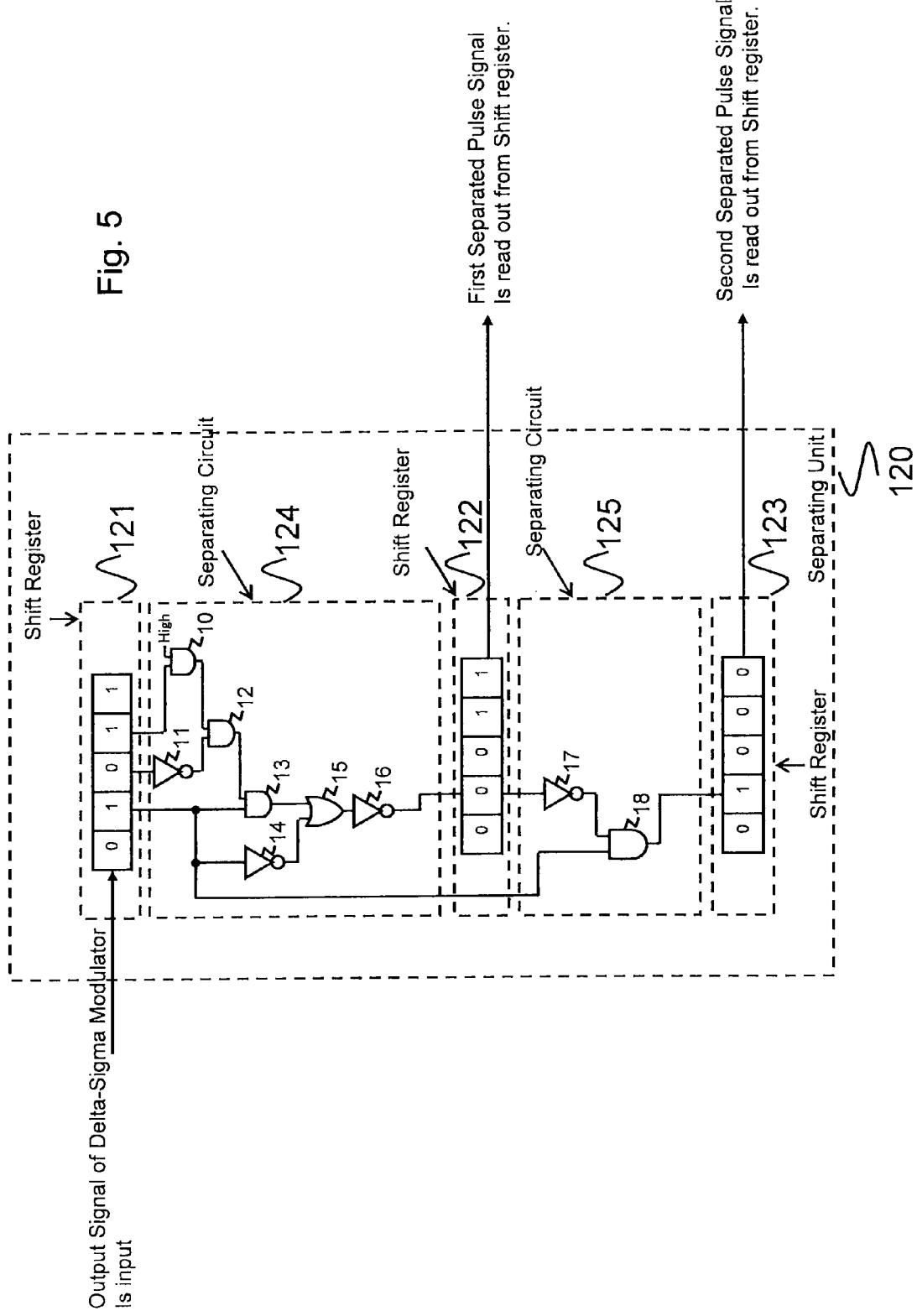
FIG. 5 is a block diagram showing an example of a separating unit.

FIG. 5 is a block diagram showing an example of the separating unit 120. The separating unit 120 separates the input pulse signal (the delta-sigma modulated signal from the delta-sigma modulator 110) into a plurality of separated pulse signals (especially, 2, 4, 8, 16, ... and so on of separated pulse signals). The maximum frequency of the input pulse signal is equal to the clock frequency. The maximum frequency of the separated pulse signal is lower than the clock frequency. Hereinafter, the separating unit 120 will be explained with an example that the separating unit 120 separates the input pulse signal into two separated pulse signals. A logical OR of the plurality of the separated pulse signals is equal to the input pulse signal that is not separated.

The separating unit 120 includes a shift-register 121, a shift register 122 for outputting a first separated pulse signal, a shift register 123 for outputting a second separated pulse signal, a separating circuit 124 for separating the pulse signal into the first separated pulse signal, and a separating circuit 125 for separating the pulse signal into the second separated pulse signal. Although FIG. 5 shows an example in which each of the shift registers 121-123 has a 5 bit number, the bit number of each of the shift registers 121-123 is not restricted to 5. Hereinafter, "the Xth bit value of a shift register (or simply the Xth bit value)" means "a value of the Xth bit from the left in the shift register".

The separating circuit 124 includes an AND circuit 10 for a logical AND operation of High ("1") and the 4th bit value of the shift register 121, a NOT circuit 11 for a logical NOT operation of the 3rd value of the shift register 121, an AND circuit 12 for a logical AND operation of the output value of the AND circuit 10 and the output value of the NOT circuit 11, an AND circuit 13 for a logical AND operation of the output value of the AND circuit 12 and the 2nd value of the shift register 121, a NOT circuit 14 for a logical NOT operation of the 2nd value of the shift register 121, an OR circuit 15 for a logical OR operation of the output value of the AND circuit 13 and the output value of the NOT circuit 14, and a NOT circuit 16 for a logical NOT operation of the output value of the OR circuit 15. The output of the logical NOT operation result of NOT circuit 16 is input into the 2nd bit of the shift register 122.

The separating circuit 124 carries out an operation by using the 2nd, 3rd, and 4th bit values of the shift register 121 for each one bit movement (one bit shift) of the shift register 121 and outputs the operation result into the 2nd bit of the shift register 122. If the 2nd bit value of the shift register 121 is "1", the 3rd bit value of the shift register 121 is "0", and the 4th bit value of the shift register 121 is "1", the separating circuit 124 outputs "0" at the 2nd bit of the shift register 122, although the 2nd bit value of the shift register 121 is "1". Otherwise, the separating circuit 124 outputs the 2nd bit value of the shift register 121 at the 2nd bit of the shift register 122. In this way, the input pulse signal is separated into the first separated pulse signal and the first separated pulse signal is stored in the shift register 122.

The separating circuit 125 includes a NOT circuit 17 for a logical NOT operation of the 2nd bit value of the shift register 122, and an AND circuit 18 for a logical AND operation of the output value of the NOT circuit 17 and the 2nd bit value of the shift register 121.

The separating circuit 125 carries out operation by using the 2nd bit value of the shift register 121 and the 2nd bit value of the shift register 122 for each one bit movement (one bit shift) of the shift registers 121,122 and outputs the operation result to the 2nd bit of the shift register 123.

If the 2nd bit value of the shift register 121 is "1" and the 2nd bit value of the shift register 122 is "0", the separating circuit 125 outputs "1" at the 2nd bit of the shift register 123. Otherwise the separating circuit 125 outputs "0" at the 2nd bit of the shift register 123.

In this way, the input pulse signal is separated into the second separated pulse signal and the second separated pulse signal is stored in the shift register 123.

Figure 6:
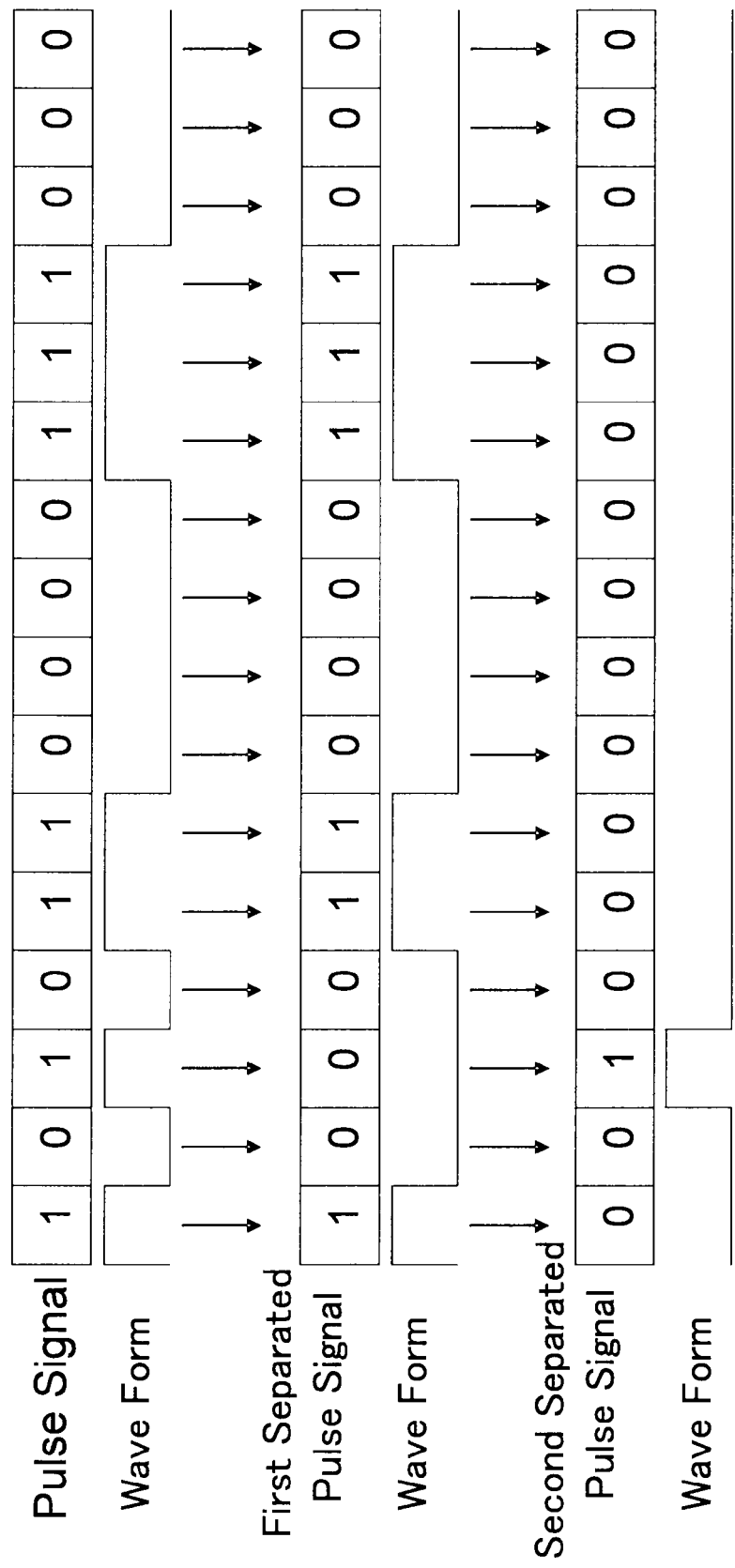
FIG. 6 is a figure showing an example of separated pulse trains.

FIG. 6 is a figure showing an example of a first and a second separated pulse signal. The first separated pulse signal is "0", if the pulse signal is "0". Outside of an exception described below, the first separated pulse signal is "1", if the pulse signal is "1". Exceptionally, a present bit of the first separated pulse signal is "0", if a present bit of the pulse signal is "1", two bits before the present bit of the first separated pulse signal is "1", and one bit before the present bit of the first separated pulse signal is "0".

The second separated pulse signal is "0", if the pulse signal is "0". The second separated pulse signal is "0", if the pulse signal is "1" and the first separated pulse signal is "1". The second separated pulse signal is "1", if the pulse signal is "1" and the first separated pulse signal is "0".

In this way, the separating unit 120 separates the pulse signal into the first and the second separated pulse signals. A frequency of the first and the second separated pulse signal is lower than the clock frequency.

Figure 7:
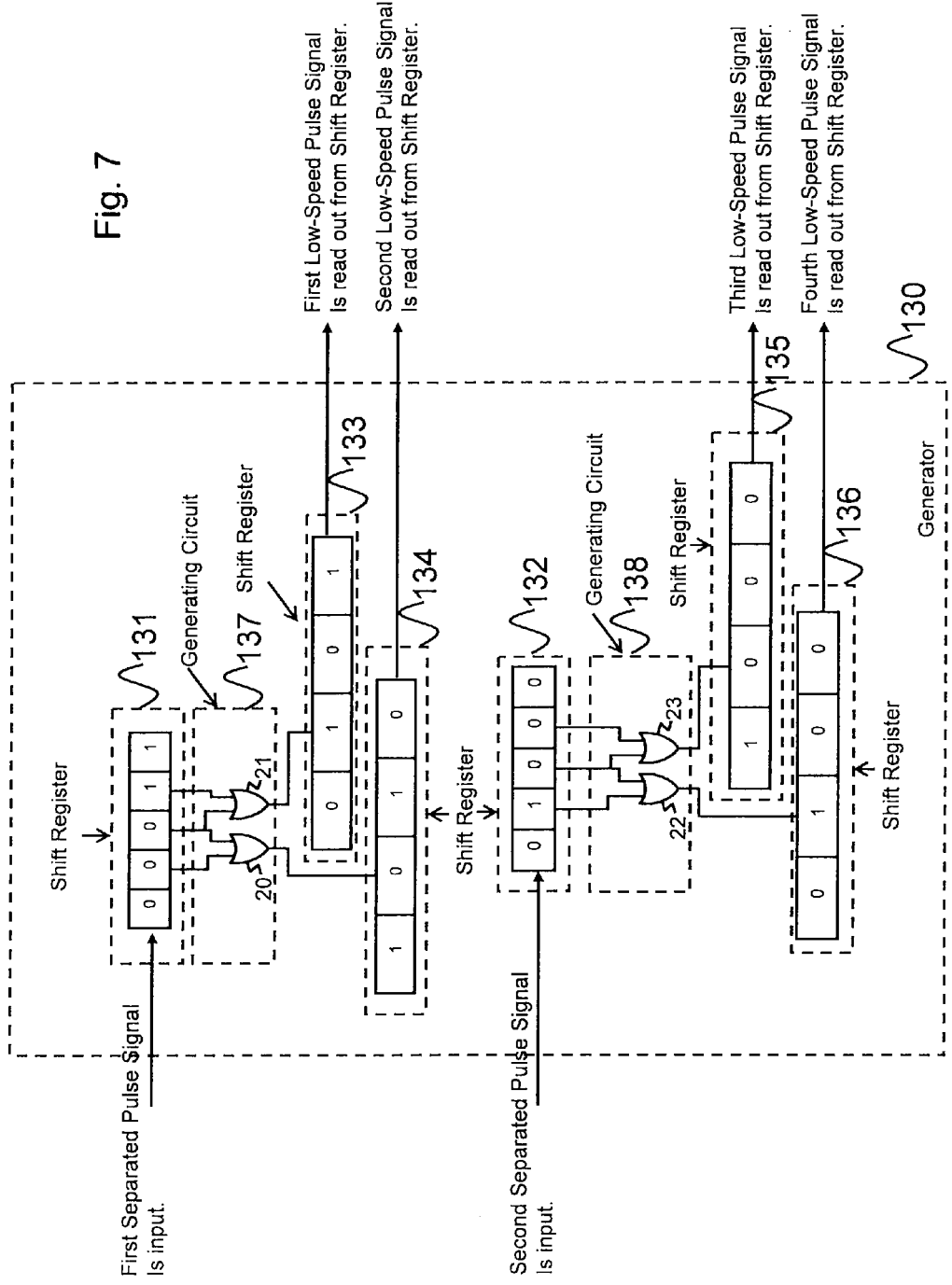
FIG. 7 is a block diagram showing an example of a generator.

FIG. 7 is a block diagram showing an example of the generator 130. The generator 130 generates a plurality of low speed pulse signals from each of the first and the second separated pulse signals. The narrowest pulse width of the low speed pulse signals is equal to or more than twice the width of the narrowest pulse width of the first and the second separated pulse signals.

Hereinafter, the generator 130 will be explained with an example that the generator 130 generates two low speed pulse signals from one separated pulse signal. A logical AND of the plurality of the low speed pulse signals is equal to the separated pulse signals.

The generator 130 includes a shift register 131 for input of the first separated pulse signal, a shift register 132 for input of the second separated pulse signal, a shift register 133 for output of the first low speed pulse signal generated from the first separated pulse signal, a shift register 134 for output of the second low speed pulse signal generated from the first separated pulse signal, a shift register 135 for output of the third low speed pulse signal generated from the second separated pulse signal, a shift register 136 for output of the fourth low speed pulse signal generated from the second separated pulse signal, a generating circuit 137 for generating the first and the second low speed pulse signal from the first separated pulse signal, and a generating circuit 138 for generating the third and the fourth low speed pulse signal from the second separated pulse signal. Although, FIG. 7 shows the bit numbers of the shift registers 131-136 is "5", the bit numbers of the shift registers 131-136 is not restricted to "5".

The generating circuit 137 includes an OR circuit 20 for a logical OR operation of the 2nd bit value of the shift register 131 and the 3rd bit value of the shift register 131 and outputting the logical OR operation result to the 2nd bit of the shift register 134, and an OR circuit 21 for a logical OR operation of the 3rd bit value of the shift register 131 and the 4th bit value of the shift register 133 and outputting the logical OR operation result to the 2nd bit of the shift register 133.

The generation circuit 137 carries out an OR operation by using the 2nd, 3rd, 4th bit values of the shift register 131 and outputs the OR operation result to the 2nd bit of the shift register 133 and the 2nd bit of the shift register 134, for each two bit movement (two bit shift) in the shift register 131. In this way, the generation circuit 137 generates the first and the second low speed pulse signal from the first separated pulse signal.

The generating circuit 138 includes an OR circuit 22 for a logical OR operation of the 2nd bit value of the shift register 132 and the 3rd bit value of the shift register 132 and outputting the logical OR operation result to the 2nd bit of the shift register 136, and an OR circuit 23 for a logical OR operation of the 3rd bit value of the shift register 132 and the 4th bit value of the shift register 132 and outputting the logical OR operation result to the 2nd bit of the shift register 135.

The generation circuit 138 carries out an OR operation by using the 2nd, 3rd, 4th bit values of the shift register 132 and outputs the OR operation result to the 2nd bit of the shift register 135 and the 2nd bit of the shift register 136, for each two bit movement (two bit shift) in the shift register 132. In this way, the generation circuit 138 generates the third and the fourth low speed pulse signal from the second separated pulse signal.

Figure 8:
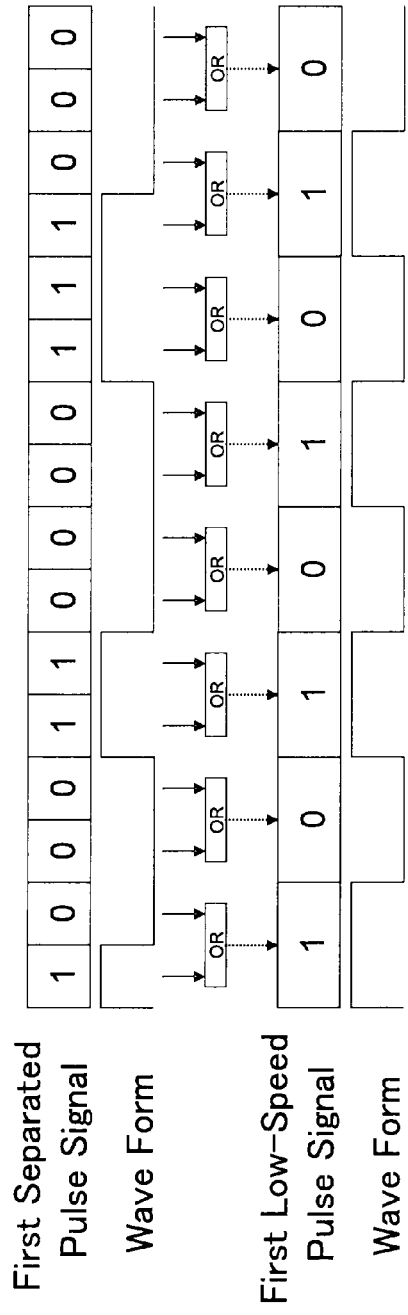
FIG. 8(a) is a figure showing an example of generating low speed pulse signals.
FIG. 8(b) is a figure showing an example of generating low speed pulse signals.
Figure 8:
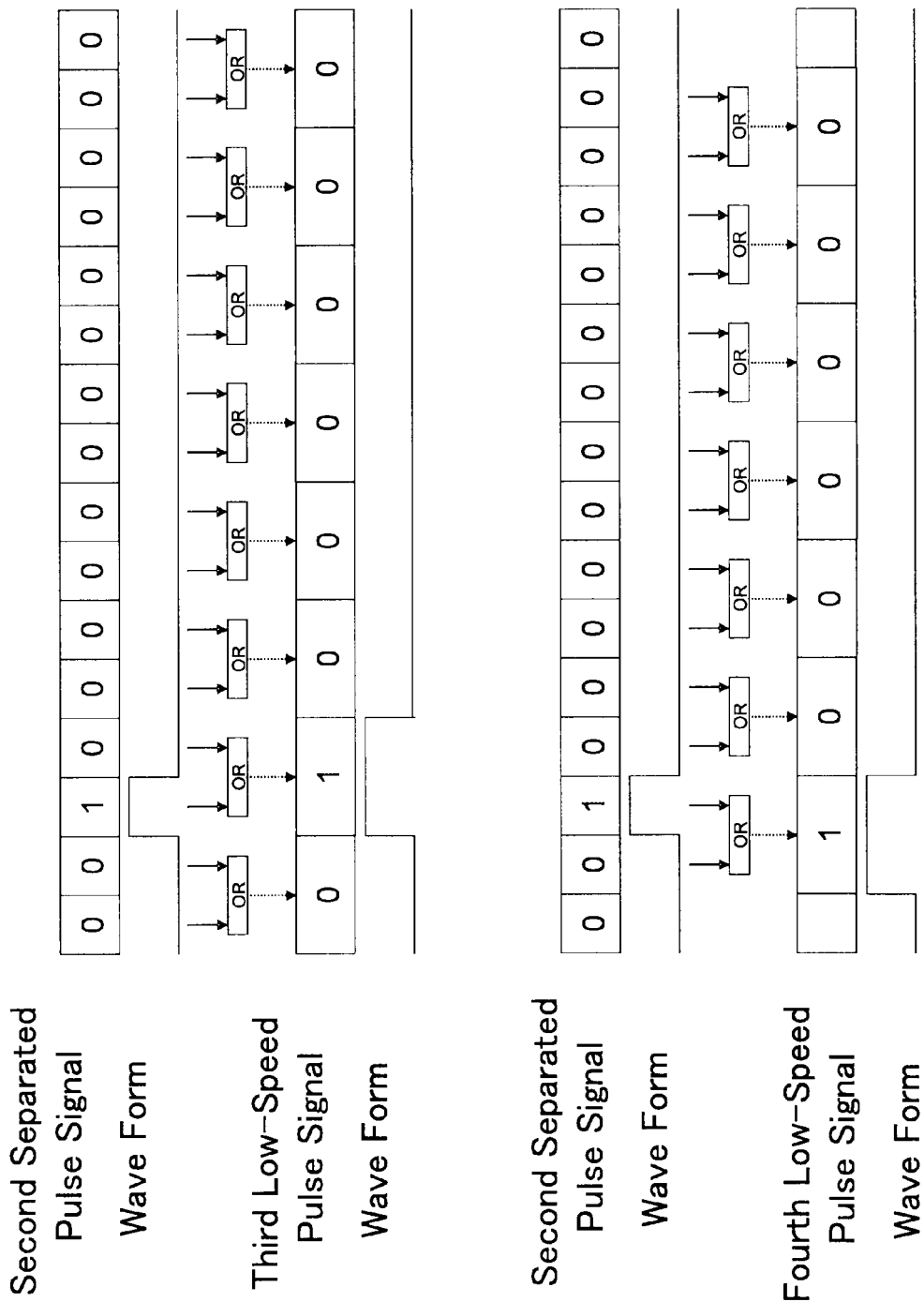

FIGS. 8(a), 8(b) are figures showing the first to the fourth low speed pulse signals generated from the first and the second separated pulse signals. Hereinafter, the low speed pulse signals will be explained with an example that the narrowest pulse width of the first to the fourth low speed pulse signals is twice a width of the narrowest pulse width of the first and the second separated pulse signals.

A logical AND of the first and the second low speed pulse signal is equal to the first separated pulse signal. A logical AND of the third and the fourth low speed pulse signal is equal to the second separated pulse signal. A frequency of the first to the fourth low speed signals is lower than a frequency of the first and the second separated pulse signals.

Figure 9:
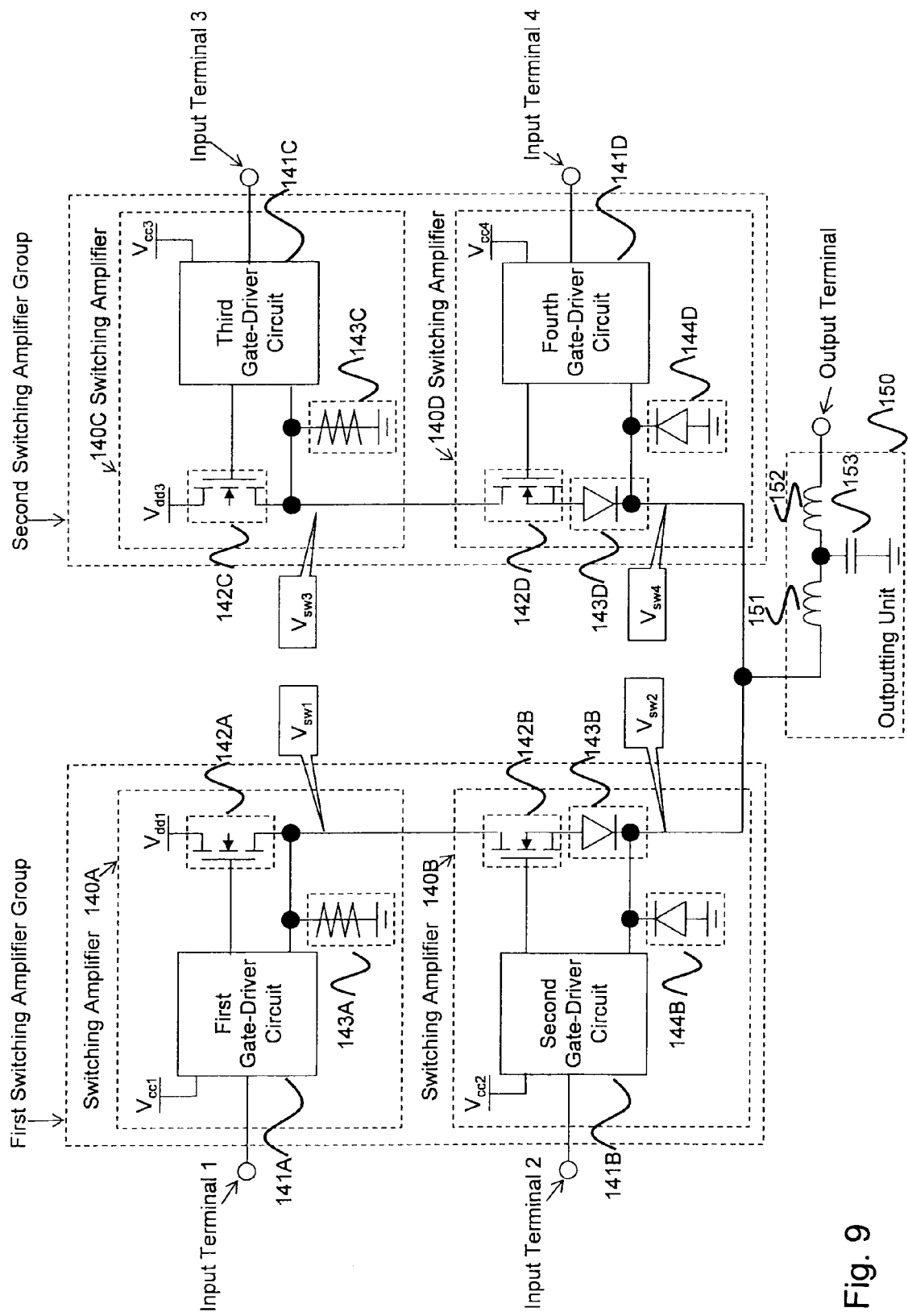
FIG. 9 is a block diagram showing an example of switching amplifiers and an outputting unit.

FIG. 9 is a block diagram showing an example of the switching amplifiers 140A-140D and outputting unit 150.

The first to the fourth low speed pulse signals are input into input terminals 1-4 of the first to the fourth switching amplifiers 140A-140D, respectively. Although FIG. 9 shows amplifiers 142A-142D are MOSFETs (Power MOSFETs), amplifiers 142A-142D may be bipolar transistors. In this case, a gate terminal (a control terminal), a drain terminal (an input terminal), and a source terminal (an output terminal) of the MOSFETs are correspond to a base terminal (a control terminal), a collector terminal (an input terminal), and an emitter terminal (an output terminal) of bipolar transistors, respectively.

The first switching amplifier 140A includes a first gate driver circuit 141A, a first MOSFET 142A, and a resistor 143A. A power-supply voltage (Vcc1) and the first low speed pulse signal are input into the first gate driver circuit 141A.

The first gate driver circuit 141A outputs a sum of a voltage of the source terminal of the first MOSFET 142A and a charged voltage of a boot strap capacity in a boot strap circuit (not shown in FIG. 9) to the gate terminal of the first MOSFET 142A, by charging the boot strap capacity. In this example shown in FIG. 9, the charged voltage of the boot strap capacity in the first gate driver circuit 141A is equal to the power-supply voltage (Vcc1).

The first gate driver circuit 141A shifts a level of the first low speed pulse signal input from the input terminal 1 and outputs a pulse signal at the gate terminal of the first MOSFET 142A. A sequence of the pulse signal output by the first gate driver circuit 141A is equal to a sequence of the first low speed pulse signal input from the input terminal 1. If the first low speed pulse signal is High ("1"), a sum (Vcc1+Vdd1 V) of a charged voltage (Vcc1) of the boot strap capacity that is equal to the power-supply voltage and a power-supply voltage (Vdd1) of the first MOSFET 142A is input into the gate terminal of the first MOSFET 142A. If the first low speed pulse signal is Low ("0"), 0 V is input into the gate terminal of the first MOSFET 142A.

The gate terminal of the first MOSFET 142A is connected with the first gate driver circuit 141A. The drain terminal of the first MOSFET 142A is connected with the power-supply (Vdd1). The source terminal of the first MOSFET 142A outputs an amplified first low speed pulse signal (Vsw1). The resistor 143A is connected between the source terminal of the first MOSFET 142A and a ground (GND).

The resistor 143A charges the boot strap capacity of the boot strap circuit in the first gate driver circuit 141A during an OFF state of the first MOSFET 142A. The resistor 143A also determines a voltage (Vsw1) between the source terminal of the first MOSFET 142A and the drain terminal of the second MOSFET 142B. The resistor 143A has a higher resistance value than an output load resistance connected with the output terminal. The resistance value of the resistor 143A may be 10 kO to 20 kO. The first switching amplifier 140A may include a diode (a schottky diode, etc) instead of the resistor 143A, a cathode of the diode being connected with the source terminal of the first MOSFET 142A, an anode of the diode being connected with the GND.

The second switching amplifier 140B includes a second gate driver circuit 141A, a second MOSFET 142B, a first diode 143B, and a second diode 144B. A power-supply (Vcc2) and the second low speed pulse signal are input into the second gate driver circuit 141B. The second gate driver circuit 141B is connected with the source terminal of the second MOSFET 142B to charge a boot strap capacity of a boot strap circuit (not shown in FIG. 9). The boot strap circuit is in the second gate driver circuit 141B. The second gate driver circuit 141B outputs a driving voltage of the second MOSFET 142B at the gate terminal of the second MOSFET 142B.

The second gate driver circuit 141B shifts a level of the second low speed pulse signal input from the input terminal 2 and outputs a pulse signal at the gate terminal of the second MOSFET 142B. A sequence of the pulse signal output by the second gate driver 141B is equal to a sequence of the second low speed pulse signal If the second low speed pulse signal is High ("1"), a sum (Vcc2+Vsw2 V) of the power-supply voltage (Vcc2) of the second gate driver circuit 141B and a cathode voltage of the first and second diode 143B, 144B is input into the gate terminal of the second MOSFET 142B. If the second low speed pulse signal is Low ("0"), 0 V is input into the gate terminal of the second MOSFET 144B.

The gate terminal of the second MOSFET 142B is connected with the second gate driver circuit 141B. The drain terminal of the second MOSFET 142B is connected with the source terminal of the first MOSFET 142A. The second MOSFET 142B amplifies the first low speed pulse signal by using the output of the first switching amplifier 140A as the power-supply. The source terminal of the second MOSFET 142B outputs a logical AND (Vws2) of the first low speed pulse signal and the second low speed pulse signal. An anode of the first diode 143B is connected with the source terminal of the second MOSFET 142B. An anode of the second diode 144B is connected with a ground (GND). A cathode of the second diode 144B is connected with a cathode of the first diode 143B. The first diode 143B prevents a reverse current. The second diode 144B provides a current to the outputting unit 150.

The third switching amplifier 140C includes a third gate driver circuit 141C, a third MOSFET 142C, and a resistor 143C. A power-supply (Vcc3) and the third low speed pulse signal are input into the third gate driver circuit 141C. The third gate driver circuit 141C is connected with the source terminal and the gate terminal of the third MOSFET 142C, the same as the first gate driver circuit 141A. The third gate driver circuit 141C outputs a driving voltage of the third MOSFET 142C at the gate terminal of the third MOSFET 142C. A sum of a charged voltage of a boot strap capacity and a voltage of the source terminal of the third MOSFET 142C is input into the gate terminal of the third MOSFET 142A by the third gate driver circuit 141C.

The third gate driver circuit 141C shifts a level of the third low speed pulse signal input from the input terminal 3 and outputs a pulse signal at the gate terminal of the third MOSFET 142C. A sequence of the pulse signal output by the third gate driver 141C is equal to a sequence of the third low speed pulse signal.

If the third low speed pulse signal is High ("1"), a sum (Vcc3+Vdd3 V) of the power-supply voltage (Vcc3) of the third gate driver circuit 141C and a power-supply voltage (Vdd3) of the third MOSFET 142C is input into the gate terminal of the third MOSFET 142C. If the third low speed pulse signal is Low ("0"), 0 V is input into the gate terminal of the third MOSFET 144C.

The gate terminal of the third MOSFET 142C is connected with the third gate driver circuit 141C. The power-supply (Vdd3) is provided to the drain terminal of third MOSFET 142C. The source terminal of the third MOSFET 142C outputs an amplified third low speed pulse signal. The resistor 143C is connected between the source terminal of the third MOSFET 142C and the GND. The resistor 143C charges the boot strap capacity of the boot strap circuit in the third gate driver circuit 141C. The resistor 143C determines a voltage (Vsw3) between the source terminal of the third MOSFET 142C and the drain terminal of the fourth MOSFET 142D. The resistor 143C has a higher resistor value than the output load resistance connected with the output terminal. The resistor value of the resistor 143C may be 10 kO to 20 kO. The third switching amplifier 140 may include a diode instead of the resistor 143C, a cathode of the diode being connected with the source terminal of the third MOSFET 142C, an anode of the diode being connected with the GND.

The fourth switching amplifier 140D includes a fourth gate driver circuit 141D, a fourth MOSFET 142D, a first diode 143D, and a second diode 144D. A power-supply (Vcc4) and the fourth low speed pulse signal are input into the fourth gate driver circuit 141D. The fourth gate driver circuit 141D charges a boot strap capacity of a boot strap circuit (not shown in FIG. 9), and outputs a driving voltage of the fourth MOSFET 142D at the gate terminal of the fourth MOSFET 142D. A sum of a voltage of the source terminal of the fourth MOSFET 142D and a charged voltage of the boot strap capacity is input into the gate terminal of the fourth MOSFET 142D.

The fourth gate driver circuit 141D shifts a level of the fourth low speed pulse signal input from the input terminal 4 and outputs a pulse signal at the gate terminal of the fourth MOSFET 142D. A sequence of the pulse signal output by the fourth gate driver 141D is equal to a sequence of the fourth low speed pulse signal If the fourth low speed pulse signal is High ("1"), a sum (Vcc4+Vsw4 V) of the power-supply voltage (Vcc4) of the fourth gate driver circuit 141D and a cathode voltage of the first and second diodes 143D, 144D is input into the gate terminal of the fourth MOSFET 142D. If the fourth low speed pulse signal is Low ("0"), 0 V is input into the gate terminal of the fourth MOSFET 144D.

The gate terminal of the fourth MOSFET 142D is connected with the fourth gate driver circuit 141D. The drain terminal of the fourth MOSFET 142D is connected with the source terminal of the third MOSFET 142C. The fourth MOSFET 142D amplifies the fourth low speed pulse signal by using the output of the third switching amplifier 140C as the power-supply. The source terminal of the fourth MOSFET 142D outputs a logical AND (Vws4) of the third low speed pulse signal and the fourth low speed pulse signal. An anode of the first diode 143D is connected with the source terminal of the fourth MOSFET 142D. An anode of the second diode 144D is connected with a ground (GND). A cathode of the second diode 144D is connected with a cathode of the first diode 143D. The first diode 143D is for preventing a reverse current. The second diode 144B is for providing a current to the outputting unit 150.

The outputting unit 150 is a low pass filter (LPF) including two inductors that are inserted in series in a signal line, and a capacitor that is connected between a connection node of the two inductors and the GND. The outputting unit 150 combines the output of the second switching amplifier 140B (the voltage (Vsw2) output by the source terminal of the second MOSFET 142B) and the output of the fourth switching amplifier 140D (the voltage (Vsw4) output by the source terminal of the fourth MOSFET 142D), and outputs the combination result.

The outputting unit 150 outputs a logical AND of the output of the second switching amplifier 140B (a logical AND of the first low speed pulse signal and the second low speed pulse signal), and the output of the fourth switching amplifier 140D (a logical AND of the third low speed pulse signal and the fourth low speed pulse signal).

Inductance values of the two inductors and a capacitance value of the capacitor included in the outputting unit 150 is determined to generate a sine wave voltage signal shown in FIG. 2 at an output load resistance of the outputting unit 150, in case an input signal of the outputting unit 150 is a delta-sigma modulated signal as shown in FIG. 4.

Figure 10:
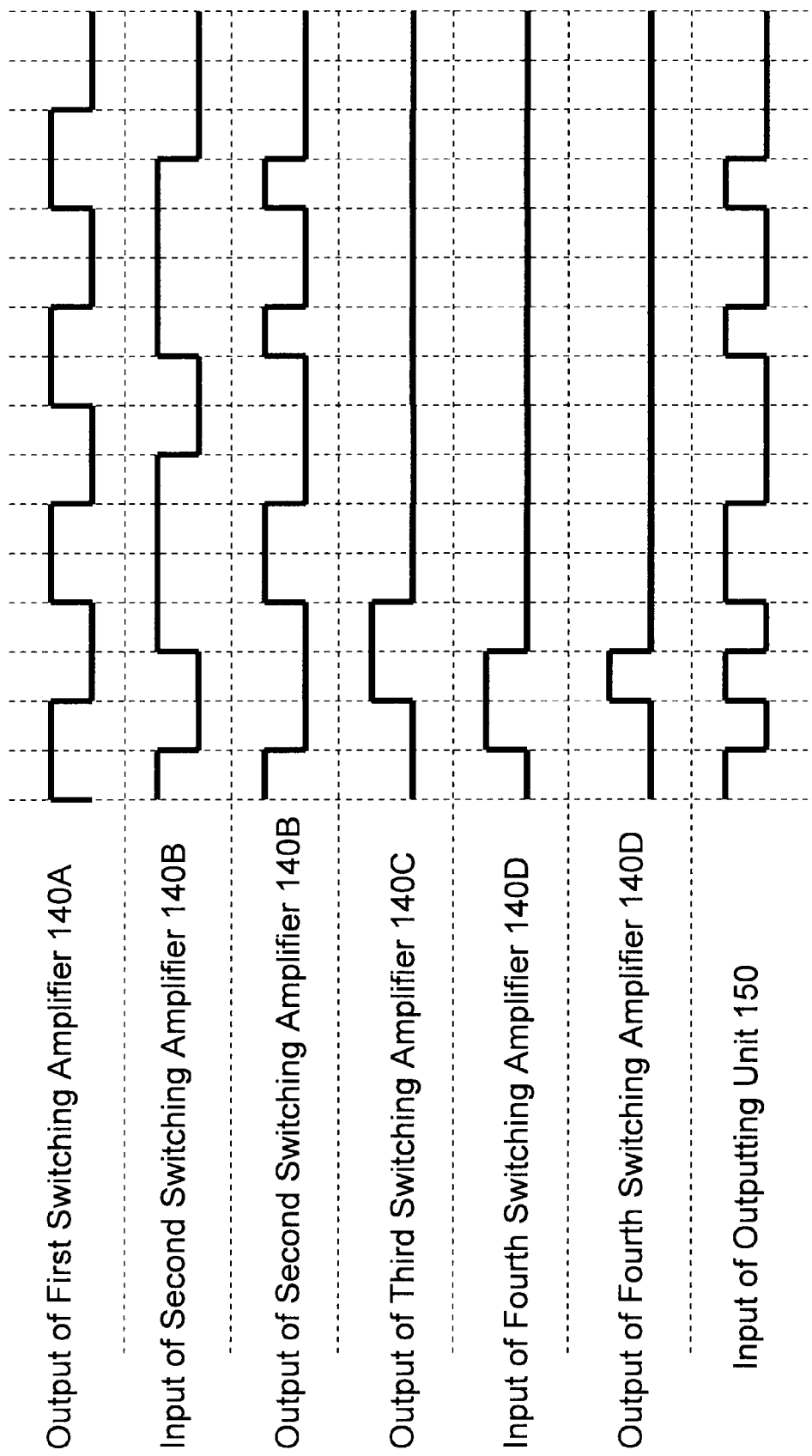
FIG. 10 is a figure showing an ideal signal of an input/output of switching amplifiers and an input of an outputting unit.

FIG. 10 is a figure showing an ideal signal of the input/output of each of switching amplifiers 140A-140D and the input of the outputting unit 150. A sequence of the output of the first switching amplifier 140A is equal to a sequence of the first low speed pulse signal. A sequence of the input of the second switching amplifier 140B is equal to a sequence of the second low speed pulse signal. A sequence of the output of the second switching amplifier 140B is equal to a logical AND of a sequence of the first low speed pulse signal and a sequence of the second low speed pulse signal. A sequence of the output of the third switching amplifier 140C is equal to a sequence of the third low speed pulse signal. A sequence of the output of the fourth switching amplifier 140D is equal to a logical AND of a sequence of the third low speed pulse signal and a sequence of the fourth low speed pulse signal.

As described above, the first to the fourth gate driver circuits 141A-141D operate at a switching speed (a switching frequency) of the first to the fourth low speed pulse signals input from input terminals 1-4, respectively. The first to the fourth gate driver circuits 141A-141D operate at a half switching speed of a delta-sigma modulated signal. A switching speed of the first and the third MOSFETs 142A, 142C is equal to a switching speed of a low speed pulse signal and is equal to a half switching speed of a delta-sigma modulated signal, respectively. A switching speed of the second and the fourth MOSFET 142B, 142D is equal to a switching speed of a delta-sigma modulated signal.

Figure 11:
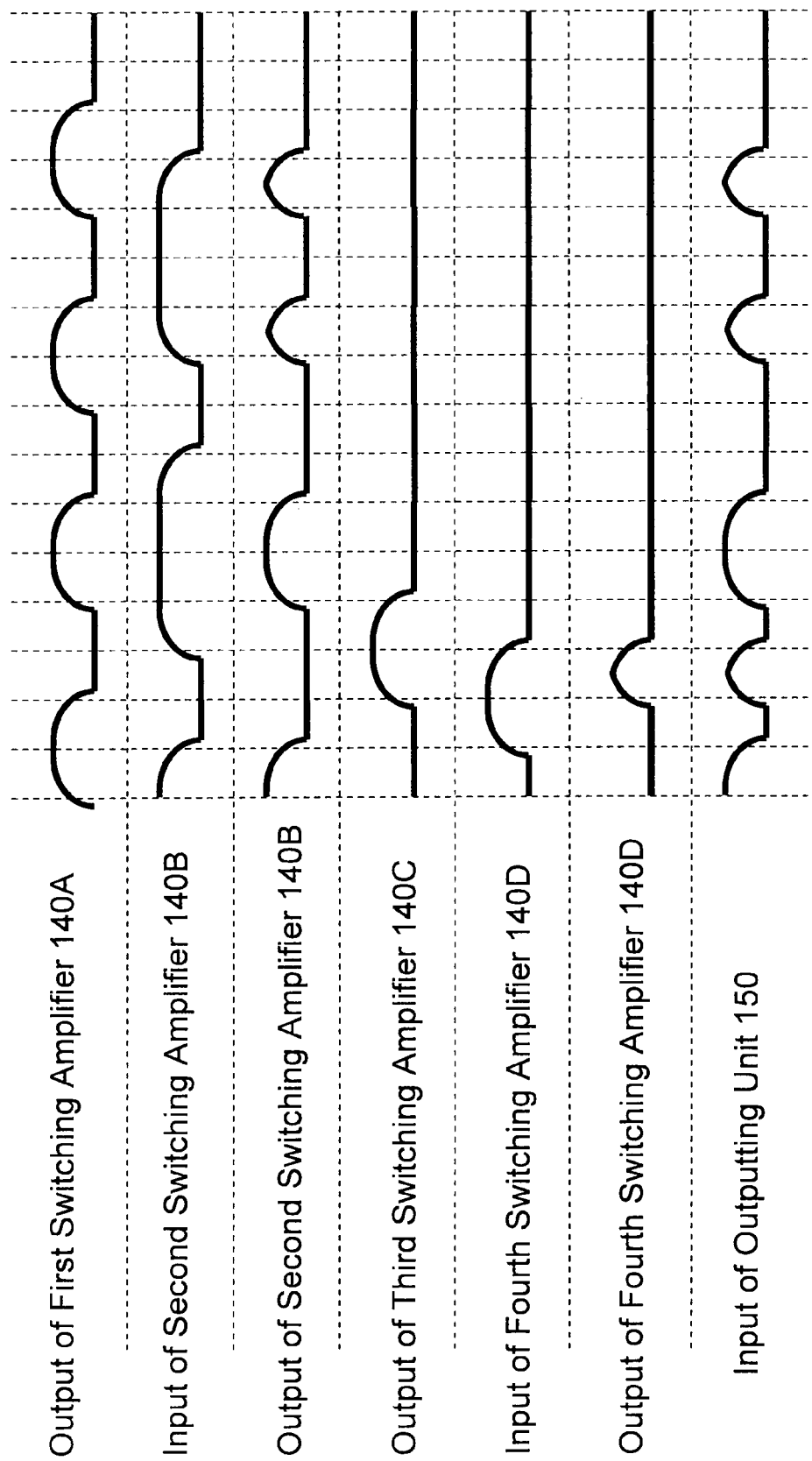
FIG. 11 is a figure showing an input/output of switching amplifiers and an input of an outputting unit.

FIG. 11 is a figure showing the input/output of each of the switching amplifiers 140A-140D and the input of the outputting unit 150 considering a rise time and a fall time of each element. As shown in FIG. 11, a pulse signal (the input/output of the each switching amplifiers 140A-140D and the input of the outputting unit 150) become dull because there are rise times and fall times caused by parasitic capacitance of gate driver circuits, MOSFETs, and diodes.

In FIG. 11, the input/output of each of the switching amplifiers 140A-140D and the input of the outputting unit 150 are described, if threshold gate terminal voltages for ON states of MOSFETs are a half of the pulse signal. In this case, although operating efficiencies of the switching amplifiers 140A-140*d* is low, the output voltage of the outputting unit 150 can be output.

Various types of gate driver circuits are currently available for sale at a market. For example, there is a High-side gate driver LTC4440 (Linear Technology corporation) and so on. Each gate driver circuit has a rise time and a fall time. An upper limit of an operating switching speed depends on a rise time and a fall time of a gate driver circuit. A gate driver can not operate at a switching speed greater than an upper limit of an operating switching speed. If a signal having a speed higher than an upper limit of an operating switching speed of a gate driver circuit is input, a gate driver circuit does not operate and does not output any signal. A rise time and a fall time of a gate driver circuit depends on an output load resistance of a gate driver circuit. If an output load resistance of a gate driver circuit is low, a rise time and a fall time of a gate driver circuit may be dozens of nanoseconds, an upper limit of an operating switching speed of a gate driver circuit may be 100 megahertz (MHz).

Upper limits of switching frequencies of a power MOSFET, a Schottky diode, and so on depend on their parasitic capacitance. A power MOSFET and a Schottky diode, which have low parasitic capacitance and are made by using gallium nitride (GaN) and so on, are being developed. Upper limits of these elements (the power MOSFET and the Schottky diode) may be hundreds of megahertz (MHz) and much higher than an upper limit of a switching frequency of a gate driver circuit. As described above, the operating speeds of the switching amplifiers 140A-140D are determined by the upper limits of the operating speed of the gate driver circuits 141A-141D.

Figure 12:
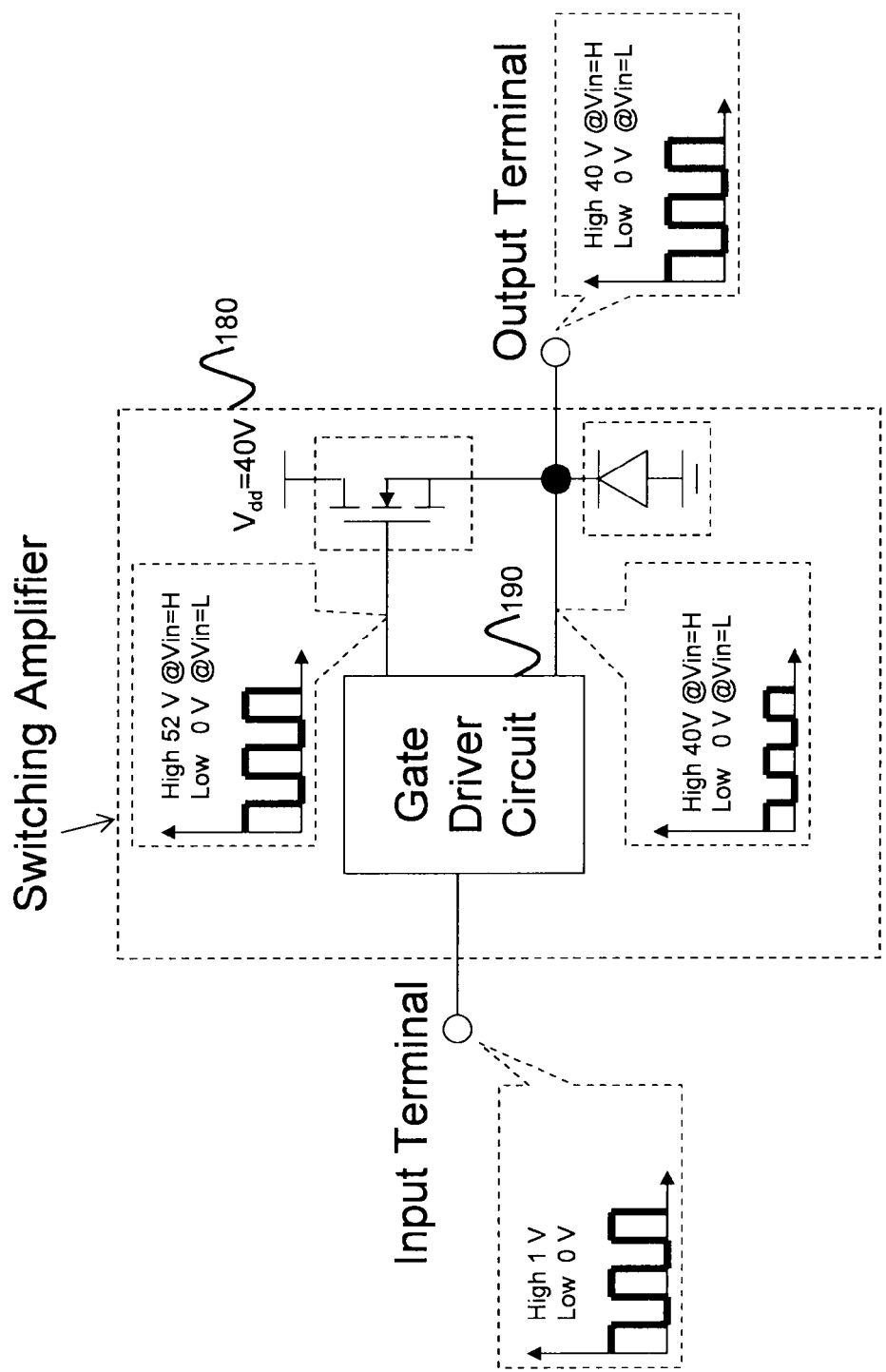
FIG. 12 is a block diagram showing an example of a switching amplifier according to a comparative example.

FIG. 12 is a diagram showing a switching amplifier 180 according to a comparative example. An upper limit of switching speed of the switching amplifier 180 according to the comparative example is equal to an upper limit of switching speed of a gate driver circuit 190. As a result, the switching amplifier according to the comparative example can output a delta-sigma modulated signal generated by a clock frequency less than 100 MHz and can not output a delta-sigma modulated signal generated by a clock frequency more than 100 MHz.

However, the switching amplifiers 140A-140D according to the first embodiment can output a delta-sigma modulated signal generated by a clock frequency less than 200 MHz, because the gate driver circuits 141A-141D can operate at a half of switching speeds of MOSFETs 142A-142D. Although the operating efficiencies of the switching amplifiers 140A-140D according to the first embodiment may be lowered as caused by the rise time and the fall time, the switching amplifiers 140A-140D can output a large-bandwidth signal.

Next, a relationship between a clock frequency of a delta-sigma modulated signal and an upper limit of an output signal frequency will be explained. If it is possible to raise a clock frequency of a delta-sigma modulated signal, then an upper limit of an output signal frequency rises. The narrowest pulse width of a delta-sigma modulated signal is equal to a half cycle of an operating clock frequency of the delta-sigma modulator 110. The operating clock frequency of the delta-sigma modulator 110 is selected based on a frequency of an input signal and an acceptable spurious level.

Figure 13:
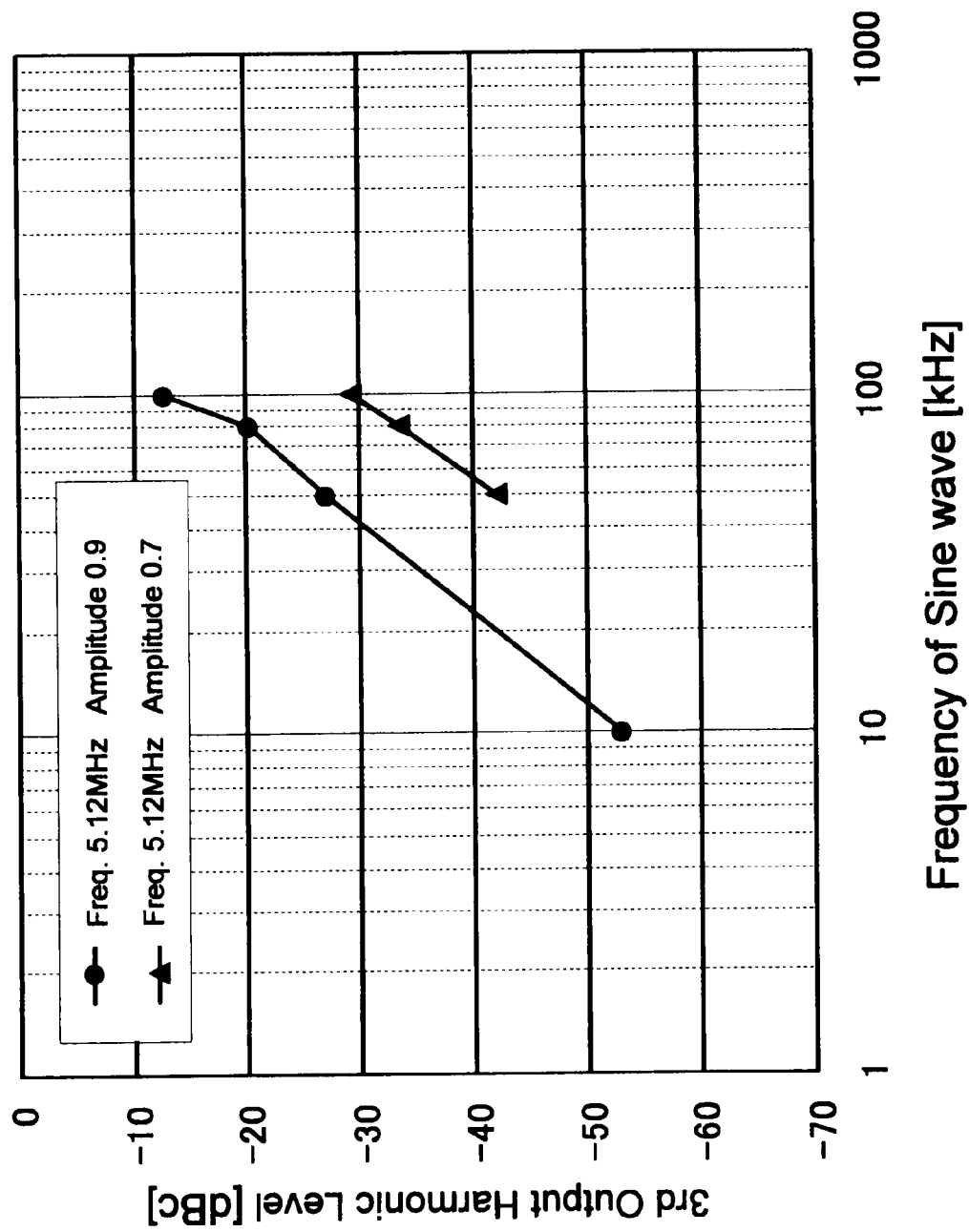
FIG. 13 is a figure showing a calculation result of a relation between a frequency of an input signal and a 3rd harmonic level.

FIG. 13 is a figure showing a calculation result of a relation between a frequency of an input signal (a sine-wave) and a 3rd output harmonic level in case a clock frequency of the delta-sigma modulator 110 (shown in FIG. 3) is 5.12 MHz. According to FIG. 13, if it is necessary that a 3rd output harmonic level is lower than −50 decibel (dBc) at a clock frequency 5.12 MHz, a frequency of an input sine-wave signal is determined to be lower than 10 kilohertz (KHz). If a frequency of an input sine-wave signal is higher than 10 kilohertz (KHz), an operating clock frequency of the delta-sigma modulator 110 is determined to be higher than 5.12 megahertz (MHz).

If an operating clock frequency of the delta-sigma modulator 110 is set to a higher value, the narrowest pulse width of an output pulse signal from the delta-sigma modulator 110 become narrower. As described above, it is necessary to raise an operating clock frequency of the delta-sigma modulator 110, to raise a frequency of an output signal. And high speed switching operations of the switching amplifiers 140A-140D are required.

Figure 14:
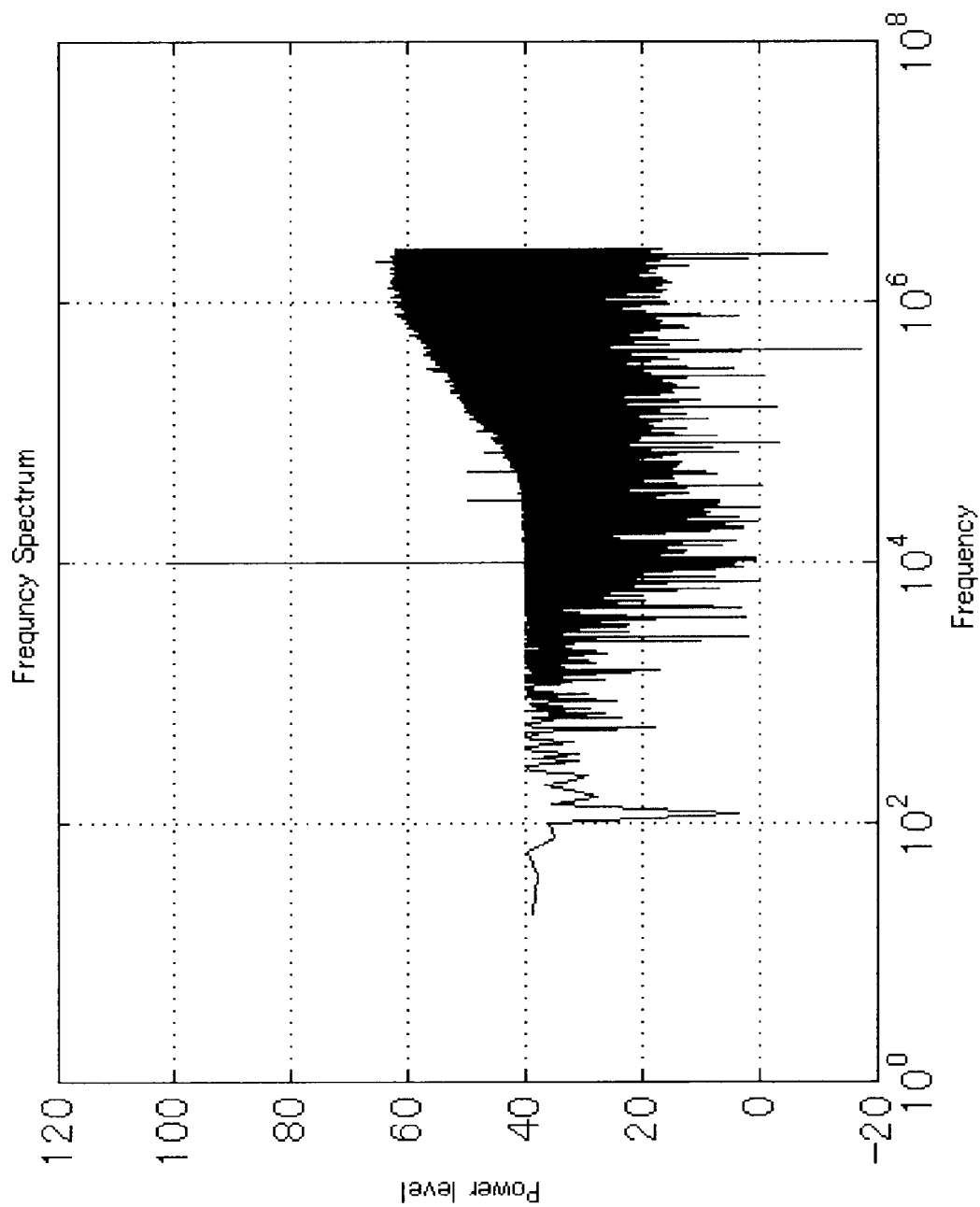
FIG. 14 is a figure showing a frequency spectrum of an output signal of a delta-sigma modulator.

For example, a switching amplifier that amplifies a pulse signal generated by using a high clock frequency is described in JP-A 2001-156554 (KOKAI) (FIG. 14, Page 15). The switching amplifiers amplify pulse signals that are interleaved and are generated by using a high clock frequency. The output signal is acquired by combining outputs of each switching amplifier.

In JP-A 2001-156554 (KOKAI) (FIG. 14, Page 15), the outputs of the switching amplifiers are not combined at source terminals of MOSFETs but are combined at a node between an inductor and an output load resistance, the inductor being connected between MOSFETs and an output load resistance. If the switching amplifiers amplify a delta-sigma modulated signal, an (amplified) output signal is different from an original pulse signal that is modulated by a delta-sigma modulation, because pulse signals are combined after the pulse signals become less sharp by an inductor. As a result, there is a problem that a dynamic range becomes narrow, because a noise shaping effect of a delta-sigma modulator is lost.

FIG. 14 is a figure showing a frequency spectrum of an output signal from the delta-sigma modulator 110 (shown in FIG. 4) when an input signal is a sine-wave signal having 10 kilohertz (KHz). A signal component other than 10 kilohertz (KHz) of the output signal from the delta-sigma modulator 110 is a noise component or a spurious component. Generally, a frequency region other than 10 kilohertz (KHz) includes a white noise.

However, in the amplifier 100 according to the first embodiment, there is a noise shaping effect that lowers a noise level at a low frequency region and raises a noise level at a high frequency region, as shown in FIG. 14. The amplifier 100 according to the first embodiment achieves a high dynamic range by cutting off a high frequency region of the output signal by using a LPF and so on.

In the comparative example shown in FIG. 12, if using one switching amplifier as a power-supply of the other switching amplifier, resistors 143A, 143C (or diode) and diodes 143B, 143D, 144B, 144D can be inserted in appropriate positions shown in FIG. 9 to acquire an output that is combined desired pulse signals.

As described above, in case a switching amplifier amplifies a pulse signal that is generated by modulating an input signal having a high frequency by a delta-sigma modulation, and in a case an operating clock frequency of a delta-sigma modulator being higher than an upper limit of a operating clock frequency of a gate driver circuit, the switching amplifier shown in FIG. 12 can not output any signals.

In contrast, the amplifier 100 according to the first embodiment achieves a large-bandwidth and a high dynamic range, because the amplifier 100 converts pulse signals generated by using a high clock frequency into low speed pulse signals and can combine the output pulse signals, which maintain pulse wave shapes, of each of the switching amplifiers 140A-140D.

The amplifier 100 according to the first embodiment can be applied to a wireless transmitter 200. Hereinafter, the wireless transmitter 200 will be explained with an example of an Envelope Elimination Restoration (EER) transmitter. An EER amplifier is one of a power-supply modulated type power amplifier that achieves a high efficiency to an amplification process by changing a power-supply of a high frequency power amplifier according to amplitude information of a modulated signal.

Figure 15:
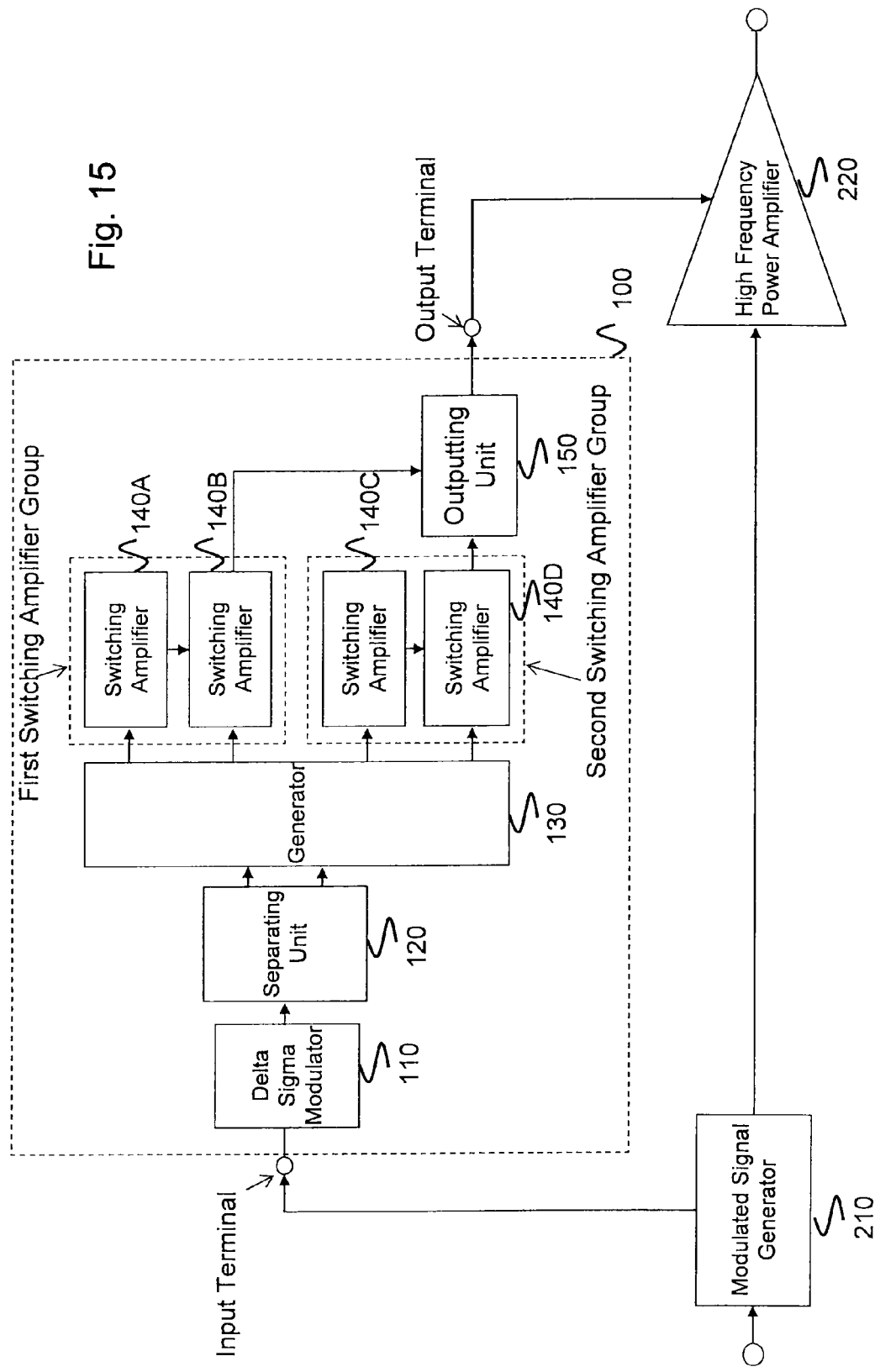
FIG. 15 is a block diagram showing an EER sending unit according to a second embodiment.

FIG. 15 is a block diagram showing the EER transmitter 200 according to the second embodiment. The transmitter 200 includes a modulated signal generator 210, the amplifier 100 according to the first embodiment, and a high frequency power amplifier 220.

The high frequency power amplifier 220 includes a modulator (such as an orthogonal modulator; not shown in FIG. 15) for generating a baseband modulated signal by superimposing a baseband signal output from the modulated signal generator 210 to a carrier signal having a high frequency.

Firstly, data to be transmitted is input into the modulated signal generator 210. The modulated signal generator 210 modulates the data to be transmitted by a modulation scheme which is any one of QPSK, 64QAM, OFDM, and so on. The modulated signal generator 210 separates a modulated sending data (a modulated signal) into an amplitude modulation component and a phase modulation component. The modulated signal generator 210 outputs the amplitude modulation component at an input terminal of the amplifier 100 and outputs the phase modulation component at an input terminal of the high frequency power amplifier 220. The amplifier 100 amplifies the amplitude modulation component and outputs an amplified amplitude modulation component at a power-supply terminal of the high frequency power amplifier 220.

The high frequency power amplifier 220 receives the amplified amplitude modulation component from the amplifier 100 and receives the phase modulation component from the modulated signal generator 210. The high frequency power amplifier 220 superimposes the amplitude modulation component on the carrier signal modulated by the phase modulation component. The high frequency power amplifier 220 includes a transistor, which is a final stage amplifier. The amplified amplitude modulation component provides a power-supply of the transistor, to change a power gain according to the amplitude modulation component.

Figure 16:
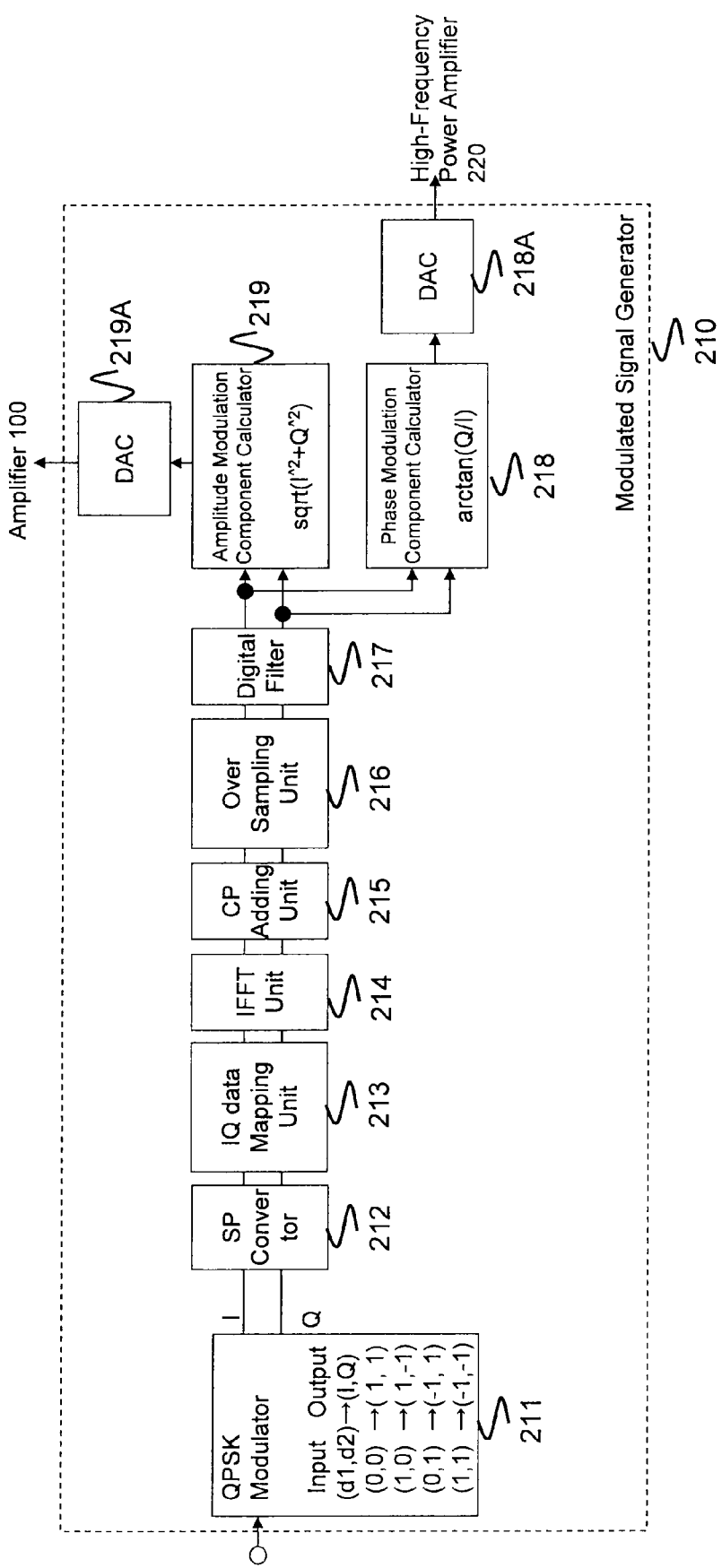
FIG. 16 is a block diagram showing an example of a modulated signal generator.

FIG. 16 is a block diagram showing an example of the modulated signal generator 210. The modulated signal generator 210 modulates the sending data by a QPSK modulation to a first-order modulation, and modulates the sending data by an OFDM modulation to a second-order modulation. The modulated signal generator 210 includes a QPSK modulator 211, a serial parallel (SP) convertor 212, an IQ data mapping unit 213, an IFFT unit 214, a cyclic prefix (CP) adding unit 215, an over sampling unit 216, a digital filter (FIR) 217, an amplitude modulation component calculator 219, a phase modulation component calculator 218, and two Digital-to-Analog converters (DAC) 218A, 219A.

The QPSK modulator 211 modulates the sending data by a QPSK modulation. The SP convertor 212 performs a serial parallel (SP) conversion by partitioning the symbol data modulated by a QPSK modulation for each OFDM symbol. The IQ data mapping unit 213 performs a mapping process that maps the signal (an IQ signal) converted serial to parallel on a frequency axis by a complex number. The IFFT unit 214 performs an IFFT process that converts the signal mapped on a frequency axis into a time signal. The CP adding unit 215 adds a cyclic prefix to the signal processed the IFFT. The over sampling unit 216 over samples the signal with the added cyclic prefix by inserting "0" on a time axis. The digital filter 217 band limits (filters) the over sampled signal on a frequency axis and smoothes the signal over sampled. The amplitude modulation component calculator 219 calculates an amplitude modulation component from the band limited signal (an IQ signal). The phase modulation component calculator 218 calculates a phase modulation component from the band limited signal (an IQ signal). The DAC 218A converts the phase modulation component (a digital signal) into an analog signal. The DAC 219A converts the amplitude modulation component (a digital signal) into an analog signal. The modulated signal generator 210 outputs the analog signal of the amplitude modulation component (hereinafter the amplitude-modulated signal) at an input terminal of the amplifier 100. The modulated signal generator 210 outputs the analog signal of the phase modulation component (hereinafter the phase-modulated signal) at an input terminal of the high frequency power amplifier 220.

The amplitude-modulated signal is amplified by the amplifier 100 (an envelope amplifier) as explained in the first embodiment and is provided to the high frequency power amplifier 220 as a power-supply. The phase-modulated signal is input into the high frequency power amplifier 220. The high frequency power amplifier 220 combines and amplifies the amplitude-modulated signal and the phase-modulated signal by amplifying the amplitude-modulated signal and using the phase-modulated signal as a power-supply.

The high frequency power amplifier 220 may be a power amplifier using a semiconductor transistor such as a hetero junction bipolar transistor (HBT), a field effect transistor, and so on. For example, if the high frequency power amplifier 220 is a FET, The power-supply provided from the envelope amplifier is input into a drain terminal (an input terminal) of the FET and the phase modulated signal is input into a gate terminal (a control terminal) of the FET.

An explanation of a processing in the EER transmitter 200 is omitted, because there is a detailed explanation in a non-patent reference (Peter B. Kenington, "High Linearity RF Amplifier Design", Artech House Microwave Library, ISBN 1-58053-143-1) incorporated herein by reference, and so on.

Figure 17:
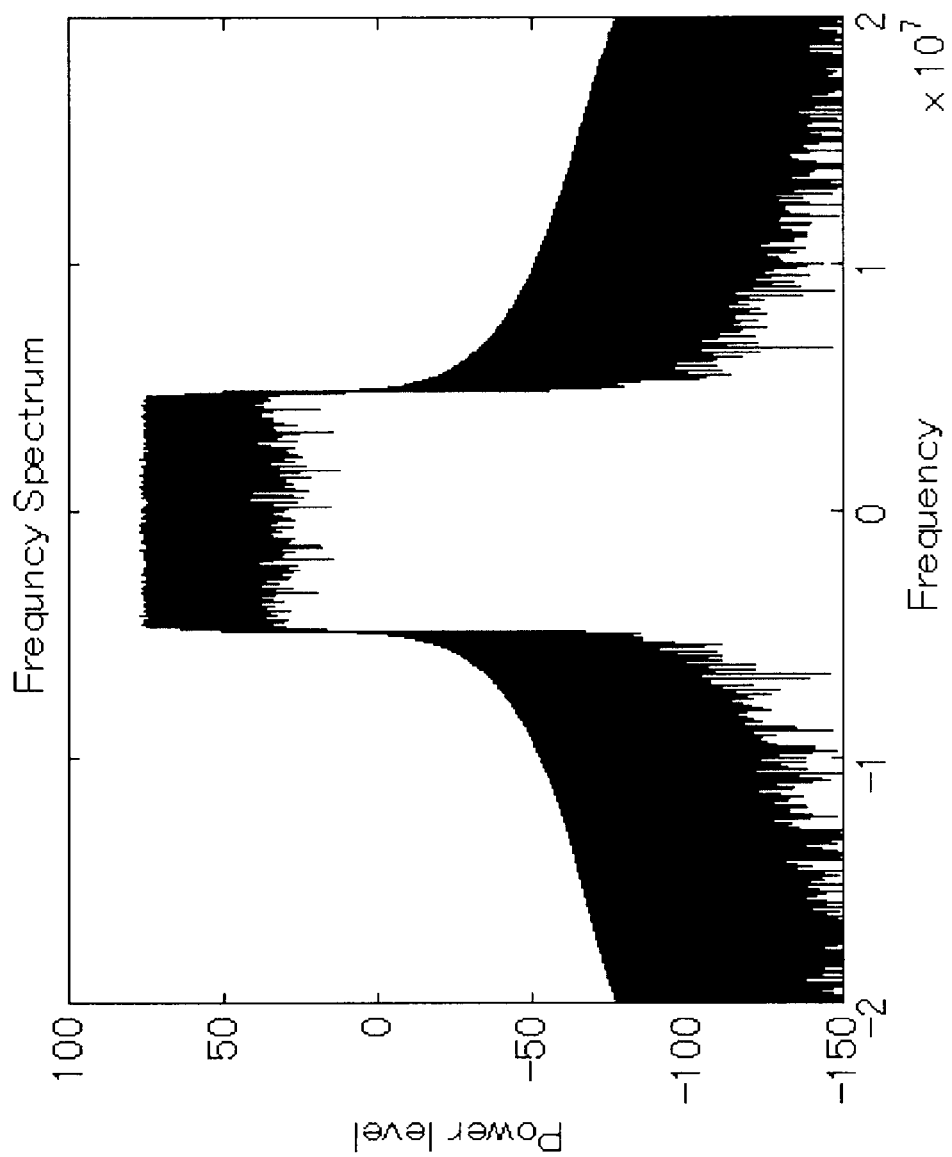
FIG. 17 is a figure showing a frequency spectrum of an output signal of a FIR.
Figure 18:
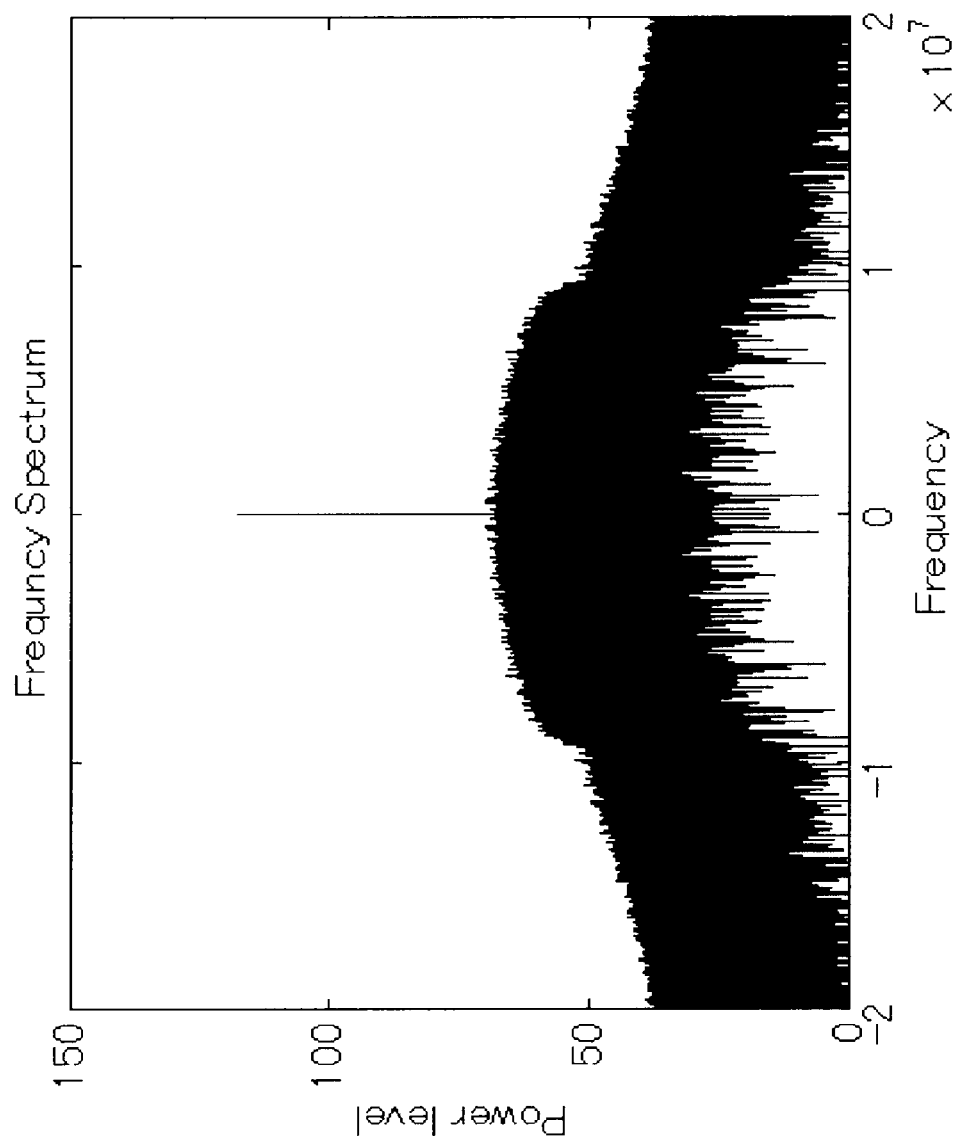
FIG. 18 is a figure showing a frequency spectrum of an amplitude-modulated signal input into a delta-sigma modulator.

FIG. 17 is a figure showing a frequency spectrum of an original modulated signal (an output signal of the digital filter 217), the original modulated signal not being separated into the amplitude modulation component and the phase modulation component. FIG. 18 is a figure showing a frequency spectrum of the amplitude-modulated signal that is input into the delta-sigma modulator 110. As shown in FIGS. 17, 18, a band-width of the amplitude-modulated signal of FIG. 18 is wider than a band-width of the original modulated signal of FIG. 17. A main-lobe width of the amplitude-modulated signal of FIG. 18 is wider than a main-lobe width of the original modulated signal of FIG. 17. Because a modulated signal having a large-bandwidth is input into the envelope amplifier, it is necessary that the clock frequency of the delta-sigma modulator 110 is set to a high value, in a case the amplitude-modulated signal is modulated by a delta-sigma modulation as described above.

An operating efficiency of the EER transmitter 200 is obtained by multiplying an operating efficiency of the high frequency power amplifier 220 by an operating efficiency of the envelope amplifier (the amplifier 100). To achieve a high operating efficiency of the EER transmitter 200, a high operating efficiency of the envelope amplifier is needed. An approach of making an envelope amplifier by using a switching amplifier having a high operating efficiency has been under review.

However, the switching amplifier shown in FIG. 12 and so on can not amplify a delta-sigma modulated signal generated by using a high clock frequency, in a case it is necessary that the switching amplifier amplify a pulse signal (the amplitude-modulated signal) modulated by a delta-sigma modulation at a high clock frequency.

The presently disclosed amplifier 100 (an envelope amplifier) solves this problem. The EER transmitter 200 according to the second embodiment achieves a high operating efficiency by using the amplifier 100 according to the first embodiment.

While certain embodiments have been described, these embodiments have been presented by way of example only, and are not intended to limit the scope of the inventions. Indeed, the novel systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fall within the scope and spirit of the inventions.

The invention claimed is:

1. An amplifier comprising:
a separating unit that separates a pulse signal into a first separated pulse signal and a second separated pulse signal, a first frequency of the first separated pulse signal and a second frequency of the second separated pulse signal being smaller than a third frequency of a clock signal, a logical OR between the first separated pulse signal and the second separated pulse signal being equal to the pulse signal;
a generator that generates a first low speed pulse signal, a second low speed pulse signal, a third low speed pulse signal, and a fourth low speed pulse signal, narrowest pulse widths included in the first low speed pulse signal and the second low speed pulse signal being equal to or wider than twice a width of a narrowest pulse width included in the first separated pulse signal, a logical AND of the first low speed pulse signal and the second low speed being equal to the first separated pulse signal, narrowest pulse widths included in the third low speed pulse signal and the fourth low speed pulse signal being equal to or wider than twice a width of a narrowest pulse width included in the second separated pulse signal, a logical AND of the third low speed pulse signal and the fourth low speed being equal to the second separated pulse signal;
a first switching amplifier that amplifies the first low speed pulse signal;
a second switching amplifier that amplifies the second low speed pulse signal by using the output of the first switching amplifier as a power-supply to obtain a first output pulse signal that is equal to a logical AND of the first low speed pulse signal and the second low speed pulse signal;
a third switching amplifier that amplifies the third low speed pulse signal;
a fourth switching amplifier that amplifies the fourth low speed pulse signal by using the output of the third switching amplifier as a power-supply to obtain a second output pulse signal that is equal to a logical AND of the third low speed pulse signal and the fourth low speed pulse signal; and
an outputting unit that outputs a logical OR of the first output pulse signal and the second output pulse signal.

2. The amplifier of claim 1, wherein
the first switching amplifier includes:
a first driver circuit that outputs a first driving voltage according to the first low speed pulse signal, and
a first transistor that includes a first control terminal to receive the first driving voltage, a first input terminal to receive a power-supply, and a first output terminal to output an amplified first low speed pulse signal;
the second switching amplifier includes:
a second driving circuit that outputs a second driving voltage according to the second low speed pulse signal, and
a second transistor that includes a second control terminal to receive the second driving voltage, a second input terminal connected with the first output terminal, and a second output terminal to output the first output pulse signal at the outputting unit;
the third switching amplifier includes:
a third driver circuit that outputs a third driving voltage according to the third low speed pulse signal, and
a third transistor that includes a third control terminal to receive the third driving voltage, a third input terminal to receive a power-supply, and a third output terminal to output an amplified third low speed pulse signal; and the fourth switching amplifier includes:
a fourth driving circuit that outputs a fourth driving voltage according to the fourth low speed pulse signal, and
a fourth transistor that includes a fourth control terminal to receive the fourth driving voltage, a fourth input terminal connected with the third output terminal, and a fourth output terminal to output the second output pulse signal at the outputting unit.

3. The amplifier of claim 2, wherein
the first switching amplifier further includes either at least one of a first resistor or a first diode, the first resistor connected between the first output terminal and ground, a cathode of the first diode connected with the first output terminal, an anode of the first diode connected with ground,
the second switching amplifier further includes a second diode and a third diode, an anode of the second diode connected with the second output terminal, a cathode of the third diode connected with a cathode of the second diode, an anode of the third diode connected with ground,
the third switching amplifier further includes either at least one of a second resistor or a fourth diode, the second resistor connected between the third output terminal and ground, a cathode of the fourth diode connected with the third output terminal, an anode of the fourth diode connected with ground,
the fourth switching amplifier further includes a fifth diode and a sixth diode, an anode of the fifth diode connected with the fourth output terminal, a cathode of the sixth diode connected with a cathode of the fifth diode, an anode of the sixth diode connected with ground, and
the outputting unit is a low-pass filter including an inductor.

4. A wireless transmitter comprising:
a modulated signal generator that generates an amplitude-modulated signal and a phase-modulated signal;
the amplifier of claim 1 that amplifies the amplitude-modulated signal to obtain an amplified amplitude-modulated signal; and
a power amplifier that receives the amplified amplitude-modulated signal and the phase-modulated signal generated by the modulated signal generator and that amplifies the phase-modulated signal by using the amplified amplitude-modulated signal as a power supply.

5. An amplifier comprising:
a separating unit that separates a pulse signal into a first separated pulse signal at a first frequency and a second separated pulse signal at a second frequency, a logical OR of the first separated pulse signal and the second separated pulse signal being equal to the pulse signal;
a generator that generates a first low speed pulse signal, a second low speed pulse signal, a third low speed pulse signal, and a fourth low speed pulse signal, a logical AND of the first low speed pulse signal and the second low speed being equal to the first separated pulse signal, a logical AND of the third low speed pulse signal and the fourth low speed being equal to the second separated pulse signal;
a first switching amplifier that amplifies the first low speed pulse signal;
a second switching amplifier that amplifies the second low speed pulse signal by using the output of the first switching amplifier as a power-supply to obtain a first output pulse signal that is equal to a logical AND of the first low speed pulse signal and the second low speed pulse signal;
a third switching amplifier that amplifies the third low speed pulse signal;
a fourth switching amplifier that amplifies the fourth low speed pulse signal by using the output of the third switching amplifier as a power-supply to obtain a second output pulse signal that is equal to a logical AND of the third low speed pulse signal and the fourth low speed pulse signal; and
an outputting unit that outputs a logical OR of the first output pulse signal and the second output pulse signal.

6. The amplifier of claim 5, wherein:
the first frequency of the first separated pulse signal and the second frequency of the second separated pulse signal are smaller than a third frequency of a clock signal.

7. The amplifier of claim 5, wherein:
narrowest pulse widths included in the first low speed pulse signal and the second low speed pulse signal are equal to or wider than twice a width of a narrowest pulse width included in the first separated pulse signal, and narrowest pulse widths included in the third low speed pulse signal and the fourth low speed pulse signal are equal to or wider than twice a width of a narrowest pulse width included in the second separated pulse signal.

8. The amplifier of claim 5, wherein
the first switching amplifier includes:
a first driver circuit that outputs a first driving voltage according to the first low speed pulse signal, and
a first transistor that includes a first control terminal to receive the first driving voltage, a first input terminal to receive a power-supply, and a first output terminal to output an amplified first low speed pulse signal;
the second switching amplifier includes:
a second driving circuit that outputs a second driving voltage according to the second low speed pulse signal, and
a second transistor that includes a second control terminal to receive the second driving voltage, a second input terminal connected with the first output terminal, and a second output terminal to output the first output pulse signal at the outputting unit;
the third switching amplifier includes:
a third driver circuit that outputs a third driving voltage according to the third low speed pulse signal, and
a third transistor that includes a third control terminal to receive the third driving voltage, a third input terminal to receive a power-supply, and a third output terminal to output an amplified third low speed pulse signal; and
the fourth switching amplifier includes:
a fourth driving circuit that outputs a fourth driving voltage according to the fourth low speed pulse signal, and
a fourth transistor that includes a fourth control terminal to receive the fourth driving voltage, a fourth input terminal connected with the third output terminal, and a fourth output terminal to output the second output pulse signal at the outputting unit.

9. The amplifier of claim 8, wherein
the first switching amplifier further includes either at least one of a first resistor or a first diode, the first resistor connected between the first output terminal and ground, a cathode of the first diode connected with the first output terminal, an anode of the first diode connected with ground, the second switching amplifier further includes a second diode and a third diode, an anode of the second diode connected with the second output terminal, a cathode of the third diode connected with a cathode of the second diode, an anode of the third diode connected with ground, the third switching amplifier further includes either at least one of a second resistor or a fourth diode, the second resistor connected between the third output terminal and ground, a cathode of the fourth diode connected with the third output terminal, an anode of the fourth diode connected with ground, the fourth switching amplifier further includes a fifth diode and a sixth diode, an anode of the fifth diode connected with the fourth output terminal, a cathode of the sixth diode connected with a cathode of the fifth diode, an anode of the sixth diode connected with ground, and the outputting unit is a low-pass filter including an inductor.

10. A wireless transmitter comprising:

a modulated signal generator that generates an amplitude-modulated signal and a phase-modulated signal;

the amplifier of claim 5 that amplifies the amplitude-modulated signal to obtain an amplified amplitude-modulated signal; and a power amplifier that receives the amplified amplitude-modulated signal and the phase-modulated signal generated by the modulated signal generator and that amplifies the phase-modulated signal by using the amplified amplitude-modulated signal as a power supply.

11. An amplifier comprising:

means for separating a pulse signal into a first separated pulse signal at a first frequency and a second separated pulse signal at a second frequency, a logical OR of the first separated pulse signal and the second separated pulse signal being equal to the pulse signal;

means for generating a first low speed pulse signal, a second low speed pulse signal, a third low speed pulse signal, and a fourth low speed pulse signal, a logical AND of the first low speed pulse signal and the second low speed being equal to the first separated pulse signal, a logical AND of the third low speed pulse signal and the fourth low speed being equal to the second separated pulse signal;

first means for amplifying the first low speed pulse signal;

second means for amplifying the second low speed pulse signal by using the output of the first means for amplifying as a power-supply to obtain a first output pulse signal that is equal to a logical AND of the first low speed pulse signal and the second low speed pulse signal;

third means for amplifying the third low speed pulse signal;

fourth means for amplifying the fourth low speed pulse signal by using the output of the third means for amplifying as a power-supply to obtain a second output pulse signal that is equal to a logical AND of the third low speed pulse signal and the fourth low speed pulse signal; and means for outputting a logical OR of the first output pulse signal and the second output pulse signal.

12. A wireless transmitter comprising:

means for generating an amplitude-modulated signal and a phase-modulated signal;

the amplifier of claim 11 that amplifies the amplitude-modulated signal to obtain an amplified amplitude-modulated signal; and means for receiving the amplified amplitude-modulated signal and the phase-modulated signal generated by the means for generating and for amplifying the phase-modulated signal by using the amplified amplitude-modulated signal as a power supply.

\* \* \* \* \*